(12) United States Patent
Sasagawa et al.

(10) Patent No.: US 9,196,744 B2
(45) Date of Patent: Nov. 24, 2015

(54) SEMICONDUCTOR DEVICE

(71) Applicant: Semiconductor Energy Laboratory Co., Ltd., Atsugi-shi, Kanagawa-ken (JP)

(72) Inventors: Shinya Sasagawa, Chigasaki (JP); Motomu Kurata, Isehara (JP); Hideaki Kuwabara, Isehara (JP); Mari Terashima, Ayase (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/448,024

(22) Filed: Jul. 31, 2014

(65) Prior Publication Data
US 2014/0339552 A1  Nov. 20, 2014

Related U.S. Application Data

(62) Division of application No. 13/666,153, filed on Nov. 1, 2012, now Pat. No. 8,796,682.

(30) Foreign Application Priority Data

Nov. 11, 2011 (JP) .................. 2011-247936

(51) Int. Cl.
*H01L 29/12* (2006.01)
*H01L 29/786* (2006.01)
(Continued)

(52) U.S. Cl.
CPC ...... *H01L 29/7869* (2013.01); *H01L 29/41733* (2013.01); *H01L 29/41758* (2013.01);
(Continued)

(58) Field of Classification Search
CPC .............................. H01L 29/12; H01L 29/7869
USPC ...................................... 257/43; 438/151, 161
See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2226847 A  9/2010
(Continued)

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.
(Continued)

*Primary Examiner* — Phuc Dang
(74) *Attorney, Agent, or Firm* — Eric J. Robinson; Robinson Intellectual Property Law Office, P.C.

(57) ABSTRACT

To provide a highly reliable semiconductor device including a transistor using an oxide semiconductor. After a source electrode layer and a drain electrode layer are formed, an island-like oxide semiconductor layer is formed in a gap between these electrode layers so that a side surface of the oxide semiconductor layer is covered with a wiring, whereby light is prevented from entering the oxide semiconductor layer through the side surface. Further, a gate electrode layer is formed over the oxide semiconductor layer with a gate insulating layer interposed therebetween and impurities are introduced with the gate electrode layer used as a mask. Then, a conductive layer is provided on a side surface of the gate electrode layer in the channel length direction, whereby an Lov region is formed while maintaining a scaled-down channel length and entry of light from above into the oxide semiconductor layer is prevented.

8 Claims, 9 Drawing Sheets

(51) Int. Cl.
*H01L 29/66* (2006.01)
*H01L 29/417* (2006.01)

(52) U.S. Cl.
CPC .... *H01L29/66742* (2013.01); *H01L 29/66969* (2013.01); *H01L 29/78603* (2013.01); *H01L 29/78696* (2013.01)

(56) References Cited

U.S. PATENT DOCUMENTS

| | | | |
|---|---|---|---|
| 5,851,861 A | 12/1998 | Suzawa et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,504,663 B2 | 3/2009 | Yamazaki et al. | |
| 7,521,326 B2 | 4/2009 | Tanaka | |
| 7,598,520 B2 * | 10/2009 | Hirao et al. | 257/43 |
| 7,674,650 B2 | 3/2010 | Akimoto et al. | |
| 7,705,358 B2 | 4/2010 | Okamoto et al. | |
| 7,732,819 B2 | 6/2010 | Akimoto et al. | |
| 8,008,140 B2 | 8/2011 | Yamaguchi et al. | |
| 8,049,275 B2 | 11/2011 | Yamazaki | |
| 8,163,606 B2 | 4/2012 | Lee et al. | |
| 8,314,032 B2 * | 11/2012 | Kawamura et al. | 438/700 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292763 A1 * | 12/2006 | Hwang et al. | 438/154 |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0102311 A1 | 4/2010 | Ito et al. | |
| 2010/0109002 A1 | 5/2010 | Itagaki et al. | |
| 2011/0101334 A1 | 5/2011 | Yamazaki et al. | |
| 2011/0133177 A1 | 6/2011 | Suzawa et al. | |
| 2011/0175087 A1 | 7/2011 | Yamazaki et al. | |
| 2013/0248850 A1 * | 9/2013 | Choi et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-042690 A | 2/2007 |
| JP | 2007-096055 A | 4/2007 |
| JP | 2007-123861 A | 5/2007 |
| JP | 2010-283002 A | 12/2010 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 92, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT ", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Parks et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H at al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clarks et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

* cited by examiner

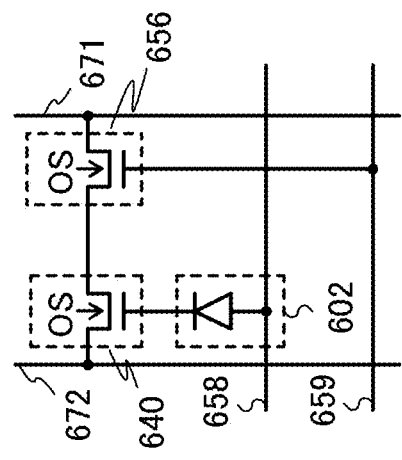
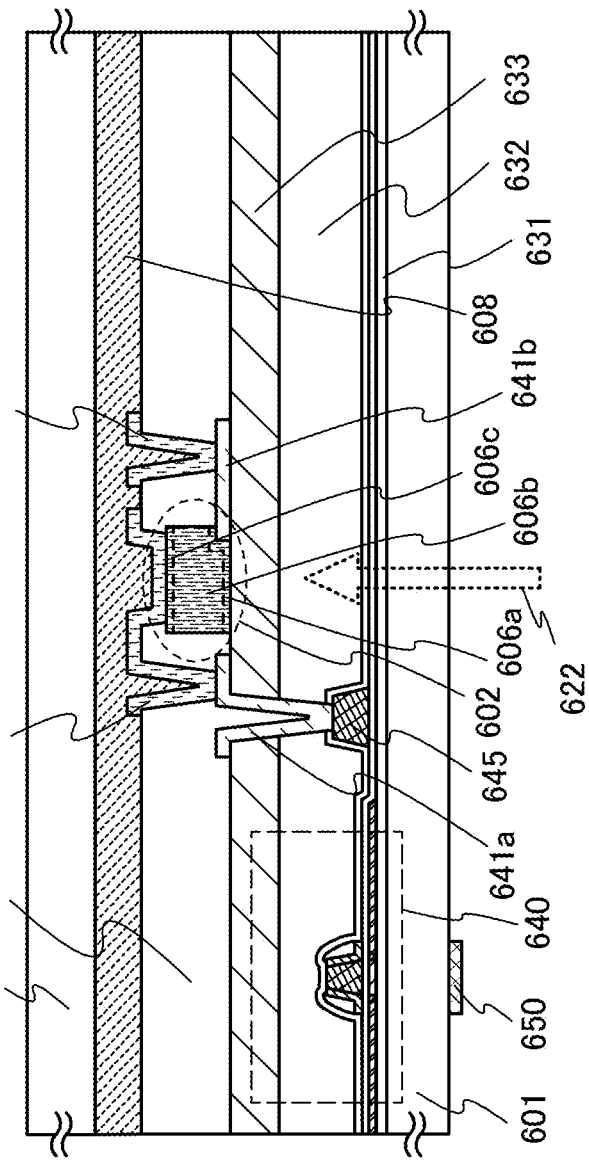
FIG. 7A
FIG. 7B

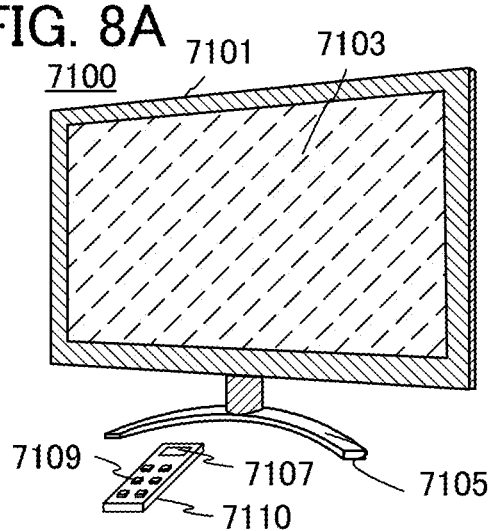
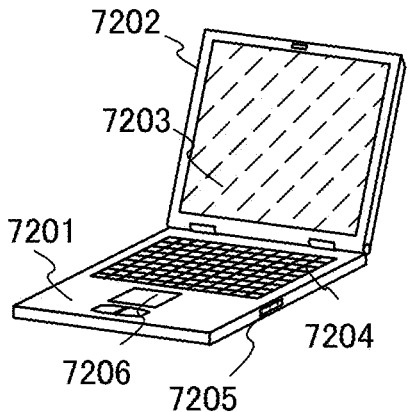
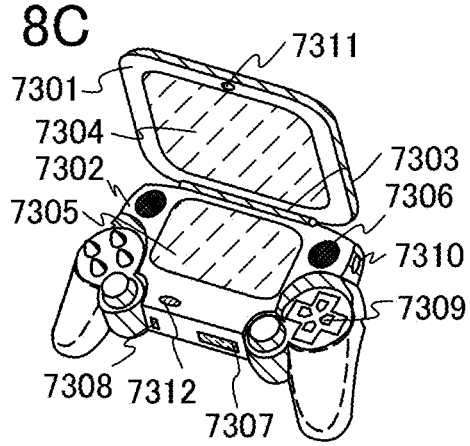
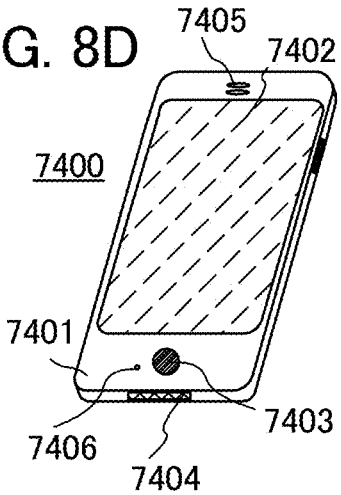
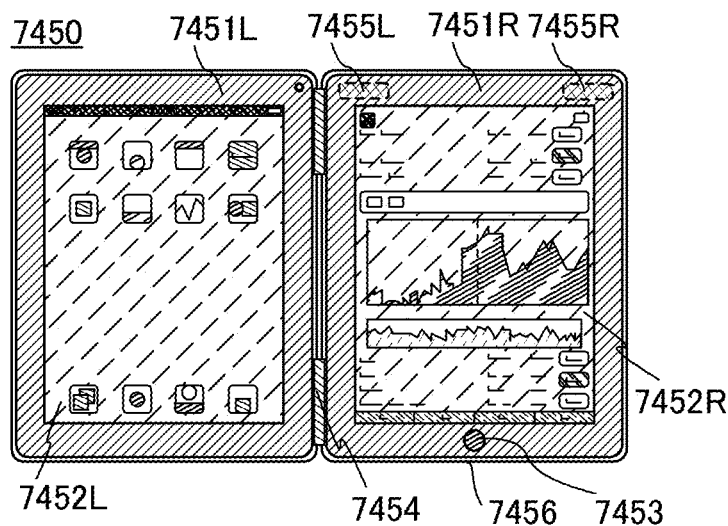

SEMICONDUCTOR DEVICE

This application is a divisional of application Ser. No. 13/666/153 filed on Nov. 1, 2012, now issued as U.S. Pat. No. 8,796,682 and claims foreign priority of JP 2011-247936 filed in Japan on Nov. 11, 2011.

BACKGROUND OF THE INVENTION

1. Field of the Invention

The present invention relates to a semiconductor device and a method for manufacturing the semiconductor device.

Note that in this specification and the like, the semiconductor device refers to any devices that can function by utilizing semiconductor characteristics, and an electro-optical device, a light-emitting display device, a semiconductor circuit, and an electronic device are all included in the category of the semiconductor device.

2. Description of the Related Art

Attention has been focused on a technique for forming a transistor using a semiconductor thin film which is formed on a substrate having an insulating surface. The transistor has been widely used for semiconductor electronic devices such as integrated circuits (ICs) and image display devices (also simply referred to as display devices). A silicon-based semiconductor material is commonly known as a material for a semiconductor thin film applicable to a transistor. As another material, an oxide semiconductor has been attracting attention.

For example, Patent Document 1 and Patent Document 2 disclose a technique in which a transistor is manufactured using zinc oxide or an In—Ga—Zn-based oxide as an oxide semiconductor and such a transistor is used as a switching element or the like of a pixel of a display device.

Further, Patent Document 3 and Patent Document 4 disclose a technique in which an oxide semiconductor thin film is formed by a coating method such as an ink-jet method.

REFERENCE

Patent Document

[Patent Document 1] Japanese Published Patent Application No. 2007-123861
[Patent Document 2] Japanese Published Patent Application No. 2007-96055
[Patent Document 3] Japanese Published Patent Application No. 2007-42690
[Patent Document 4] Japanese Published Patent Application No. 2010-283002

SUMMARY OF THE INVENTION

In a semiconductor device such as a liquid crystal display device and an EL display device, in which a transistor including an oxide semiconductor is used for a pixel portion or a driver circuit, the size of each pixel is necessarily scaled down as the display device provides a higher definition image; accordingly, a transistor used in the display device also needs to be miniaturized.

Furthermore, in order to achieve high-speed response and high-speed driving of a semiconductor device, the on-state characteristics (e.g., on-state current or field-effect mobility) of a miniaturized transistor are needed to be improved. In order to suppress a decrease in the on-state current of a transistor, it is effective to provide a region in which a gate electrode layer overlaps with a source electrode layer or a drain electrode layer with a gate insulating layer interposed therebetween (hereinafter, such a region is also referred to as an Lov region in this specification).

However, the formation of an Lov region requires precise alignment between an oxide semiconductor layer and a gate electrode layer which have a narrow width. The required precision increases with miniaturization of transistors, which might cause a decrease in the yield of miniaturized transistors in the manufacturing process.

It is known that the electrical characteristics of a transistor using an oxide semiconductor are changed by irradiation with intense light (such a change is referred to as light degradation). Therefore, in the case where a transistor using an oxide semiconductor is applied to, for example, a liquid crystal display device including a backlight, the transistor using an oxide semiconductor is irradiated with light from the backlight, which might cause light degradation of the transistor. In the transistor degraded by light, a leakage current is generated due to light excitation even in the off state, leading to a decrease in display quality.

In view of the above, an object of one embodiment of the present invention is to provide a method for manufacturing a transistor with high yield, the transistor being miniaturized while maintaining good properties.

Another object of one embodiment of the present invention is to provide a semiconductor device with high reliability which includes a transistor using an oxide semiconductor.

In one embodiment of the disclosed invention, after a source electrode layer and a drain electrode layer are formed, an island-like oxide semiconductor layer is formed in a gap between these electrode layers so that a side surface of the oxide semiconductor layer in a channel length direction is covered with a wiring, whereby light is prevented from entering the oxide semiconductor layer through the side surface. Further, a gate electrode layer is formed over the oxide semiconductor layer with a gate insulating layer interposed therebetween and impurities are introduced with the gate electrode layer used as a mask. Then, a conductive layer is provided on a side surface of the gate electrode layer in the channel length direction, whereby an Lov region is formed while maintaining a scaled-down channel length and entry of light from above into the oxide semiconductor layer is prevented. The conductive layer provided in contact with the side surface of the gate electrode layer in the channel length direction is formed in such a manner that a conductive film and an insulating layer are formed to cover the gate electrode layer, the insulating layer is processed into a sidewall insulating layer, and the conductive film is processed with the sidewall insulating layer used as a mask. Accordingly, a scaled-down conductive layer touching the side surface of the gate electrode layer can be formed in a self-aligned manner. More specifically, the following structures can be employed, for example.

One embodiment of the present invention is a method for manufacturing a semiconductor device, which includes the steps of forming a source electrode layer and a drain electrode layer over an insulating surface; forming an oxide semiconductor layer in a gap between the source electrode layer and the drain electrode layer by a coating method; forming a gate insulating layer in contact with a top surface of the source electrode layer, the drain electrode layer, and the oxide semiconductor layer; forming a gate electrode layer in a region overlapping with the oxide semiconductor layer with the gate insulating layer interposed therebetween; introducing an impurity element into the oxide semiconductor layer with the gate electrode layer used as a mask, thereby forming in the oxide semiconductor layer a pair of impurity regions and a channel region sandwiched between the pair of impurity regions; forming a conductive film covering the gate electrode layer; forming an insulating layer over the conductive film; processing the insulating layer, thereby forming a sidewall insulating layer on a side surface of the gate electrode layer with the conductive film interposed therebetween; and etching the conductive film with the sidewall insulating layer used as a mask, thereby forming a conductive layer in contact with the side surface of the gate electrode layer.

Another embodiment of the present invention is a method for manufacturing a semiconductor device, which includes the steps of forming a source electrode layer and a drain electrode layer over an insulating surface; forming an oxide semiconductor layer in a gap between the source electrode layer and the drain electrode layer by a coating method, and then performing heat treatment on the oxide semiconductor layer; forming a gate insulating layer in contact with a top surface of the source electrode layer, the drain electrode layer, and the oxide semiconductor layer; forming a gate electrode layer in a region overlapping with the oxide semiconductor layer with the gate insulating layer interposed therebetween; introducing an impurity element into the oxide semiconductor layer with the gate electrode layer used as a mask, thereby forming in the oxide semiconductor layer a pair of impurity regions and a channel region sandwiched between the pair of impurity regions; forming a conductive film covering the gate electrode layer; forming an insulating layer over the conductive film; processing the insulating layer, thereby forming a sidewall insulating layer on a side surface of the gate electrode layer with the conductive film interposed therebetween; and etching the conductive film with the sidewall insulating layer used as a mask, thereby forming a conductive layer in contact with the side surface of the gate electrode layer.

In the above methods for manufacturing a semiconductor device, an interlayer insulating layer may be formed to cover the sidewall insulating layer and the gate electrode layer, and an opening may be formed in the interlayer insulating layer and the gate insulating layer so as to reach the source electrode layer or the drain electrode layer, then a wiring layer may be formed in the opening. As the interlayer insulating layer, a layer including an aluminum oxide film is preferably formed.

Note that in this specification, "aligning with" includes "substantially aligning with". For example, a side surface of a layer A and a side surface of a layer B, which are included in a stacked structure etched using the same mask, are considered to align with each other.

According to one embodiment of the present invention, a transistor which is miniaturized while maintaining good properties can be manufactured with high yield.

Further, according to one embodiment of the present invention, a semiconductor device with high reliability, which includes a transistor using an oxide semiconductor, can be provided.

BRIEF DESCRIPTION OF THE DRAWINGS

In the accompanying drawings:

FIGS. 7A and 7B are respectively a circuit diagram and a cross-sectional view illustrating one embodiment of a semiconductor device;

FIGS. 8A to 8E illustrate examples of electronic devices; and

DETAILED DESCRIPTION OF THE INVENTION

Figure 1A:
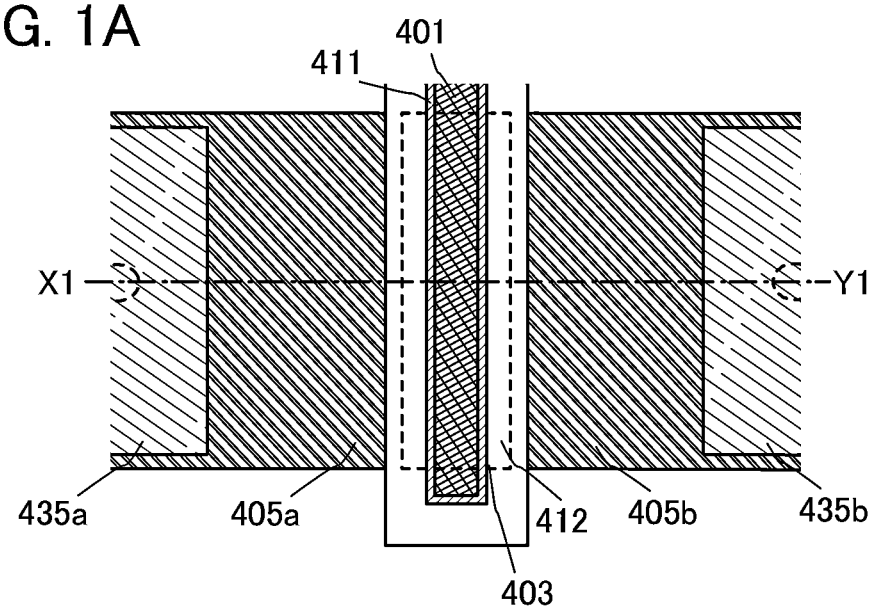
FIGS. 1A and 1B are respectively a top view and a cross-sectional view illustrating one embodiment of a semiconductor device.

Examples of embodiments of the present invention will be described below with reference to drawings. Note that the present invention is not limited to the following description, and it is apparent to those skilled in the art that modes and details can be modified in a wide variety of ways without departing from the spirit and scope of the present invention. Therefore, the present invention is not interpreted as being limited to the description of the embodiments below.

Note that in the structures of the present invention described below, the same parts or parts having a similar function are denoted with the same reference numerals in different drawings, and the description thereof is not repeated. Further, the same hatching pattern is applied to parts having a similar function, and the parts are not especially denoted by reference numerals in some cases.

Note that in this specification and the like, the ordinal numbers such as "first" and "second" are used for convenience and do not denote the order of steps or the stacking order of layers. In addition, the ordinal numbers in this specification and the like do not denote particular names which specify the present invention.

Embodiment 1

In this embodiment, one embodiment of a semiconductor device and a method for manufacturing the semiconductor device will be described with reference to FIGS. 1A and 1B, FIGS. 2A to 2C, FIGS. 3A to 3D, and FIGS. 4A to 4C.

Figure 1B:
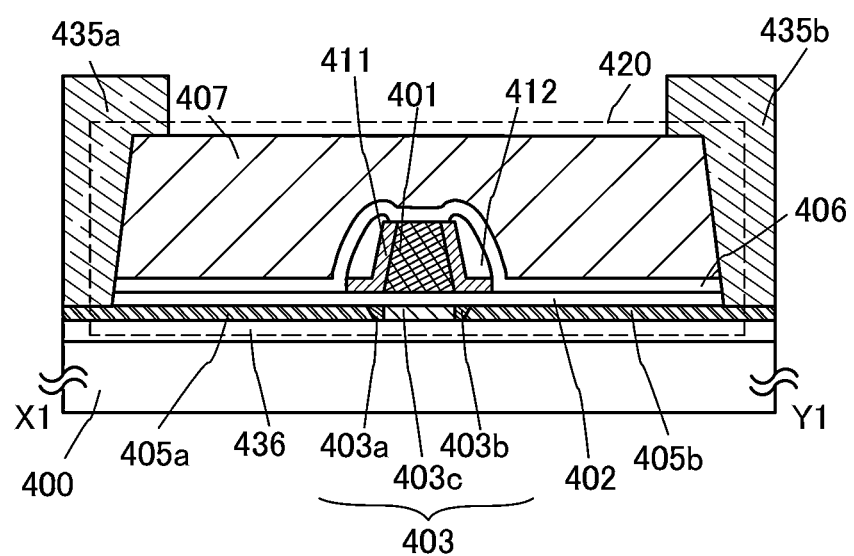

FIGS. 1A and 1B are respectively a top view and a cross-sectional view of a transistor 420 which is an example of a semiconductor device. FIG. 1A is a top view of the transistor 420 and FIG. 1B is a cross-sectional view along line X1-Y1 of FIG. 1A. Note that in FIG. 1A, some components of the transistor 420 (e.g., an insulating layer 407) are omitted for simplicity.

The transistor 420 illustrated in FIGS. 1A and 1B includes the following components formed over a substrate 400 having an insulating surface: a base insulating layer 436, a source electrode layer 405a and a drain electrode layer 405b, an oxide semiconductor layer 403 including an impurity region 403a, an impurity region 403b, and a channel region 403c, a gate insulating layer 402 in contact with the oxide semiconductor layer 403, the source electrode layer 405a, and the drain electrode layer 405b, a gate electrode layer 401 overlapping with the channel region 403c with the gate insulating layer 402 interposed therebetween, a conductive layer 411 in contact with a side surface of the gate electrode layer 401, and a sidewall insulating layer 412 provided on a side surface of the conductive layer 411 so as to face the gate electrode layer 401.

The oxide semiconductor layer 403 touches the source electrode layer 405a on a side surface of the impurity region 403a in a channel length direction, and touches the drain electrode layer 405b on a side surface of the impurity region 403b in the channel length direction.

In a cross section in the channel length direction of the transistor 420, at least a part of the conductive layer 411 is provided over the source electrode layer 405a and the drain electrode layer 405b with the gate insulating layer 402 interposed therebetween. The conductive layer 411 is provided in contact with the side surface of the gate electrode layer 401 and capable of functioning as a part of the gate electrode layer 401. Accordingly, on the cross section in the channel length direction, the conductive layer 411 overlaps with the source electrode layer 405a and the drain electrode layer 405b with the gate insulating layer 402 interposed therebetween, and such regions can be regarded as Lov regions.

The sidewall insulating layer 412 is provided in contact with a part of the side surface of the conductive layer 411 so as to face the gate electrode layer 401. The conductive layer 411 is formed in such a manner that a conductive film covering the gate electrode layer 401 is processed with the sidewall insulating layer 412 used as a mask in a manufacturing process. Thus, a side edge of the conductive layer 411 is aligned with a side edge of the sidewall insulating layer 412.

Note that the Lov region with a large length might increase the parasitic capacitance in this region; in this embodiment, however, the length of the Lov region can be controlled by the length of the sidewall insulating layer 412 which is provided in a self-aligned manner on the side surface of the gate electrode layer 401 with the conductive layer 411 interposed therebetween. As a result, a scaled-down Lov region can be processed with high precision.

The transistor 420 illustrated in FIGS. 1A and 1B may include, as its components, an insulating layer 406 and the insulating layer 407 which are provided over the sidewall insulating layer 412 and the gate electrode layer 401, and a wiring layer 435a and a wiring layer 435b which are provided over the insulating layer 407. The wiring layer 435a is electrically connected to the source electrode layer 405a via an opening provided in the insulating layer 406, the insulating layer 407, and the gate insulating layer 402, and the wiring layer 435b is electrically connected to the drain electrode layer 405b via an opening provided in the insulating layer 406, the insulating layer 407, and the gate insulating layer 402.

The oxide semiconductor layer 403 includes the impurity region 403a and the impurity region 403b which are formed in a self-aligned manner when a dopant is introduced into the oxide semiconductor layer 403 with the gate electrode layer 401 used as a mask. These impurity regions are capable of functioning as a source region or a drain region of the transistor 420, and have a lower resistance than the channel region 403c. The impurity region 403a and the impurity region 403b allow a reduction in the electric field applied to the channel region 403c provided between the pair of impurity regions. In addition, since the source electrode layer 405a and the drain electrode layer 405b are in contact with the respective impurity regions, it is possible to reduce the contact resistance between the oxide semiconductor layer 403 and each of the source electrode layer 405a and the drain electrode layer 405b.

Further, the oxide semiconductor layer 403 has a longer length in the channel length direction than the gate electrode layer 401 in the channel length direction; thus, the gate electrode layer 401 can be formed with a higher degree of freedom in alignment. In addition, the channel length of the transistor 420 can be reduced because the oxide semiconductor layer 403 includes the impurity regions. As a result, a miniaturized transistor can be manufactured with high yield.

A dopant included in the impurity region 403a and the impurity region 403b is an impurity that changes the conductivity of the oxide semiconductor layer 403. As the dopant, one or more selected from Group 15 elements (typically, phosphorus (P), arsenic (As), and antimony (Sb)), boron (B), aluminum (Al), nitrogen (N), argon (Ar), helium (He), neon (Ne), indium (In), titanium (Ti), and zinc (Zn) can be used. The dopant can be introduced by an ion implantation method, an ion doping method, a plasma immersion ion implantation method, or the like.

The source electrode layer 405a and the drain electrode layer 405b in the transistor 420 each have a tapered shape on a side surface touching the oxide semiconductor layer 403. The taper angle of each of the source electrode layer 405a and the drain electrode layer 405b can be set to, for example, 20° to 50° inclusive. Note that the taper angle means here an inclination angle between the side surface and the bottom surface of a layer having a tapered shape (here, the source electrode layer 405a or the drain electrode layer 405b) when the layer is observed from the direction perpendicular to its cross section.

When the source electrode layer 405a and the drain electrode layer 405b have a tapered side surface, the contact area with the oxide semiconductor layer 403 can be increased, leading to a reduction in contact resistance.

Moreover, when the source electrode layer 405a and the drain electrode layer 405b have a tapered shape, the oxide semiconductor layer 403 provided in contact with the source electrode layer 405a and the drain electrode layer 405b has an inversely tapered shape on its side surface in the channel length direction. In the case where the oxide semiconductor layer 403 includes an oxide semiconductor having crystallinity, it is possible to suppress the occurrence of oxygen vacancies which may be caused by release of oxygen from the side surface of the oxide semiconductor layer 403, and the leakage current of the transistor 420 can be reduced.

Further, the inversely tapered shape of the oxide semiconductor layer 403 makes it possible to increase the length of the top surface of the oxide semiconductor layer 403 in the channel length direction, the top surface being in contact with the gate insulating layer 402. Accordingly, the gate electrode layer 401 can be formed over the oxide semiconductor layer 403 with the gate insulating layer 402 interposed therebetween with a higher degree of freedom in alignment. Furthermore, the electric field between the source electrode layer 405a and the drain electrode layer 405b can be effectively reduced.

An example of a method for manufacturing the transistor in this embodiment will be described below with reference to FIGS. 2A to 2C and FIGS. 3A to 3D.

First, the base insulating layer 436 is formed over the substrate 400 having an insulating surface.

There is no particular limitation on the substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 420 including the oxide semiconductor layer 403 may be directly formed over a flexible substrate; or alternatively, the transistor 420 including the oxide semiconductor layer 403 may be formed over a substrate and then separated from the substrate and transferred to a flexible substrate. Note that in order to separate the transistor 420 from the manufacturing substrate and transfer it to the flexible substrate, a separation layer may be provided between the manufacturing substrate and the transistor 420 including the oxide semiconductor layer.

The base insulating layer 436 can have a single-layer structure or a stacked structure of one or more films containing silicon oxide, silicon nitride, silicon oxynitride, silicon nitride oxide, aluminum oxide, aluminum nitride, aluminum oxynitride, aluminum nitride oxide, hafnium oxide, gallium oxide, or a mixed material of any of these materials. Note that the base insulating layer 436 preferably has a single-layer structure or a stacked structure including an oxide insulating film so that the oxide insulating film is in contact with the oxide semiconductor layer 403 to be formed later. Note that the base insulating layer 436 is not necessarily provided.

The base insulating layer 436 preferably includes a region containing oxygen the proportion of which is higher than the stoichiometric proportion (hereinafter, also referred to as an oxygen-excess region), in which case oxygen vacancies in the oxide semiconductor layer 403 to be formed later can be filled with the excess oxygen contained in the base insulating layer 436. In the case where the base insulating layer 436 has a stacked structure, an oxygen-excess region is preferably provided at least in a layer in contact with the oxide semiconductor layer 403. In order to provide the oxygen-excess region in the base insulating layer 436, for example, the base insulating layer 436 may be deposited in an oxygen atmosphere. Alternatively, the oxygen-excess region may be formed by introducing oxygen (including at least one of an oxygen radical, an oxygen atom, and an oxygen ion) into the base insulating layer 436 after its deposition. Oxygen can be introduced by an ion implantation method, an ion doping method, a plasma immersion ion implantation method, plasma treatment, or the like.

Figure 2A:
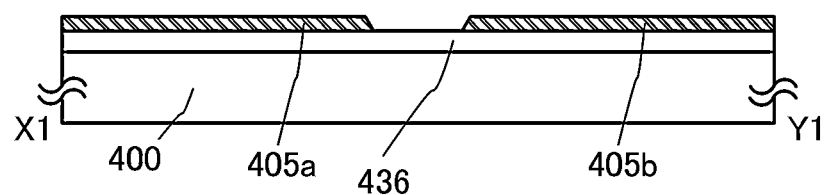
FIGS. 2A to 2C illustrate an example of a method for manufacturing a semiconductor device.
Figure 2B:
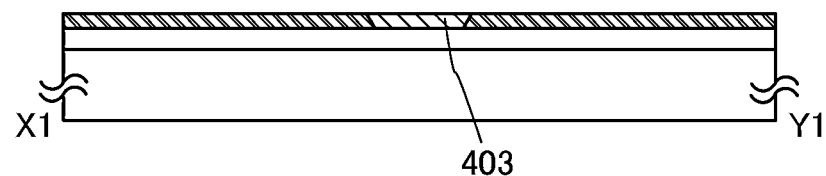
Figure 2C:
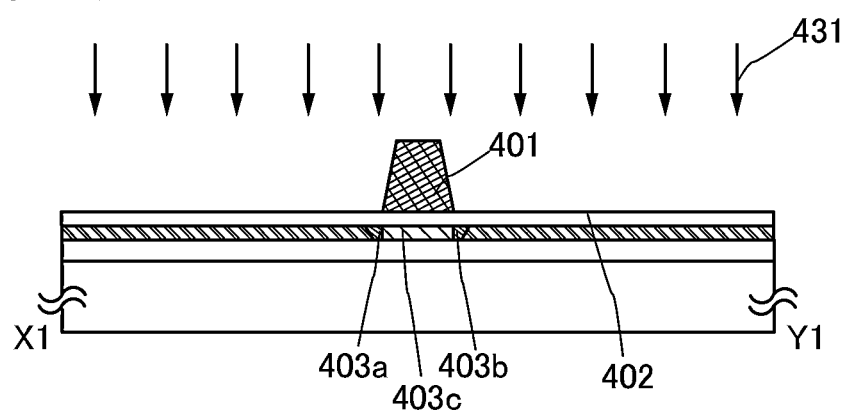

Then, a conductive film serving as a source electrode layer and a drain electrode layer (including wirings formed using these layers) is formed over the base insulating layer 436, and subjected to selective etching treatment using a mask formed in a photolithography step, whereby the source electrode layer 405a and the drain electrode layer 405b are formed (see FIG. 2A).

The source electrode layer 405a and the drain electrode layer 405b are formed of a material that can withstand heat treatment performed later. It is possible to use, for example, a metal film containing an element selected from Al, Cr, Cu, Ta, Ti, Mo, and W, or a metal nitride film containing any of the above-mentioned elements as its component (a titanium nitride film, a molybdenum nitride film, or a tungsten nitride film). Alternatively, it is possible to use a structure in which a film of a high-melting-point metal such as Ti, Mo, or W or a metal nitride film thereof (e.g., a titanium nitride film, a molybdenum nitride film, or a tungsten nitride film) is stacked over and/or below a metal film such as an Al film or a Cu film. Further alternatively, a conductive metal oxide may be used for forming the source electrode layer 405a and the drain electrode layer 405b. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials containing silicon oxide can be used.

Then, the island-like oxide semiconductor layer 403 is formed so that a gap between the source electrode layer 405a and the drain electrode layer 405b is filled with the island-like oxide semiconductor layer 403.

In this embodiment, the oxide semiconductor layer 403 is formed in the following manner for example: metal oxide microparticles ground to a size smaller than 1 μm, preferably greater than or equal to 1 nm and smaller than or equal to 100 nm, and more preferably greater than or equal to 3 nm and smaller than or equal to 50 nm are dispersed in a solvent (also referred to as a dispersant) having a function of suppressing the aggregation of metal oxide microparticles, and such a solution is applied on the base insulating layer 436 by a spin coating method, a dipping method, a spraying method, a droplet discharge method (such as an ink-jet method), screen printing, offset printing, a doctor knife, a roll coater, a curtain coater, a knife coater, a nozzle printing method, a mist CVD (chemical vapor deposition) method, or the like; after that, the solution is subjected to heat treatment.

The heat treatment may be performed on the solution at a temperature at which the dispersant evaporates and the metal oxide microparticles are bonded to each other; for example, higher than or equal to 150° C. and lower than or equal to 400° C. Although there is no particular limitation on the kind of apparatus used for the heat treatment, the heat treatment is preferably performed using an apparatus which allows heating in a reduced pressure atmosphere in order to effectively remove the dispersant in the solution.

Note that a solution for forming the oxide semiconductor layer 403 is preferably applied on the base insulating layer 436 by a method for directly forming a pattern on a subject region, such as a droplet discharge method, in which case patterning is not required so that the process can be simplified and scaling-down processing can be performed with high yield.

In this embodiment, the oxide semiconductor layer 403 is formed by applying a solution containing metal oxide microparticles; however, the embodiment of the present invention is not limited to this. For example, the oxide semiconductor layer 403 may be formed in such a manner that a solution containing metal salt of a metal included in the oxide semiconductor layer 403 is applied on the base insulating layer 436 and subjected to thermal oxidation treatment. As the thermal oxidation treatment, for example, oxygen plasma treatment can be performed.

The oxide semiconductor layer 403 preferably contains at least indium (In) or zinc (Zn). In particular, both In and Zn are preferably contained. In addition, as a stabilizer for reducing variation in the electrical characteristics of a transistor using the oxide semiconductor layer 403, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor layer 403, for example, the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

A material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

The oxide semiconductor layer may have either a single-layer structure or a stacked structure. Further, the oxide semiconductor layer may have either an amorphous structure or a crystalline structure. In the case where the oxide semiconductor layer has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., more preferably higher than or equal to 500° C., and still more preferably higher than or equal to 550° C. Note that the heat treatment can also serve as another heat treatment in the manufacturing process.

Before the formation of the oxide semiconductor layer 403, planarization treatment may be performed on the surface on which the oxide semiconductor layer 403 is to be formed. As the planarization treatment, dry-etching treatment or plasma treatment can be used, though there is no particular limitation on the planarization treatment.

As the plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of argon, nitrogen, helium, oxygen, or the like may be used. The reverse sputtering can remove particle substances (also referred to as particles or dust) attached to the surface on which the oxide semiconductor layer is to be formed.

As the planarization treatment, dry etching treatment or plasma treatment may be performed plural times, or these treatments may be performed in combination. In the case where the treatments are combined, the order of steps may be set as appropriate, without particular limitation, depending on the unevenness of the surface on which the oxide semiconductor layer is to be formed.

Further, the oxide semiconductor layer 403 is preferably subjected to heat treatment for removing excess hydrogen (including water and a hydroxyl group) in the oxide semiconductor layer 403 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. Note that the heat treatment can also serve as heat treatment for evaporating the dispersant.

This heat treatment allows hydrogen, which is an impurity imparting n-type conductivity, to be removed from the oxide semiconductor. For example, the hydrogen concentration in the oxide semiconductor layer 403 after the dehydration or dehydrogenation treatment can be lower than or equal to $5\times10^{19}/cm^3$, preferably lower than or equal to $5\times10^{18}/cm^3$.

Note that the heat treatment for the dehydration or dehydrogenation may be performed at any timing in the manufacturing process of the transistor 420 as long as the heat treatment is performed after the formation of the oxide semiconductor layer. Further, the heat treatment for the dehydration or dehydrogenation may be performed plural times, and may also serve as another heat treatment.

In the heat treatment, it is preferable that water, hydrogen, and the like be not contained in nitrogen or a rare gas such as helium, neon, or argon. Alternatively, the purity of nitrogen or a rare gas such as helium, neon, or argon which is introduced into a heat treatment apparatus is preferably higher than or equal to 6N (99.9999%), more preferably higher than or equal to 7N (99.99999%) (that is, the impurity concentration is preferably lower than or equal to 1 ppm, more preferably lower than or equal to 0.1 ppm).

In addition, after the heat treatment is performed on the oxide semiconductor layer 403, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, and more preferably less than or equal to 10 ppb, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably higher than or equal to 6N, more preferably higher than or equal to 7N (that is, the impurity concentration in the oxygen gas or the dinitrogen monoxide gas is preferably lower than or equal to 1 ppm, more preferably lower than or equal to 0.1 ppm). The oxygen gas or the dinitrogen monoxide gas acts to supply oxygen that is a main component of the oxide semiconductor and that has been reduced by the dehydration or dehydrogenation step for removing an impurity, whereby the oxide semiconductor layer 403 can have high purity and be an i-type (intrinsic) oxide semiconductor layer.

Further or alternatively, oxygen (which includes at least one of an oxygen radical, an oxygen atom, and an oxygen ion) may be introduced into the oxide semiconductor layer that has been subjected to the dehydration or dehydrogenation treatment in order to supply oxygen to the oxide semiconductor layer.

Introduction (supply) of oxygen into the dehydrated or dehydrogenated oxide semiconductor layer enables the oxide semiconductor layer to be highly purified and to be i-type (intrinsic). When a transistor includes the highly-purified and i-type (intrinsic) oxide semiconductor layer, variation in the electrical characteristics of the transistor is suppressed and an electrically stable transistor can be obtained.

In the step of introducing oxygen into the oxide semiconductor layer, oxygen may be directly introduced into the oxide semiconductor layer or introduced into the oxide semiconductor layer 403 through another film such as the gate insulating layer 402 or the insulating layer 406 formed later. An ion implantation method, an ion doping method, a plasma immersion ion implantation method, or the like may be employed for the introduction of oxygen through another film, whereas plasma treatment or the like can be employed in addition to the above methods in the case of directly introducing oxygen into the exposed oxide semiconductor layer 403.

The introduction of oxygen into the oxide semiconductor layer 403 can be performed anytime after the formation of the oxide semiconductor layer 403. The step of introducing oxygen into the oxide semiconductor layer 403 may be performed plural times.

According to the method for manufacturing a transistor shown in this embodiment, etching treatment using a resist mask is not performed in the step of forming the island-like oxide semiconductor layer 403, which allows precise processing to be performed accurately even in the case where the length of the oxide semiconductor layer 403 is reduced. Thus, in the manufacturing process of the semiconductor device, the miniaturized transistor 420 with little variation in shape and characteristics can be manufactured with high yield.

Note that in this embodiment, the tops of the source electrode layer 405a and the drain electrode layer 405b are almost the same as that of the oxide semiconductor layer 403. However, the embodiment of the present invention is not limited to this structure, and the thicknesses of the source electrode layer 405a and the drain electrode layer 405b are different from that of the oxide semiconductor layer 403 in some cases.

Next, the gate insulating layer 402 is formed over the oxide semiconductor layer 403, the source electrode layer 405a, and the drain electrode layer 405b. Note that a side surface of the oxide semiconductor layer 403 in the channel width direction is in contact with the gate insulating layer 402.

The gate insulating layer 402 can be formed to a thickness greater than or equal to 1 nm and less than or equal to 20 nm by a sputtering method, an MBE (molecular beam epitaxy) method, a CVD method, a pulsed laser deposition method, an ALD (atomic layer deposition) method, or the like as appropriate. The gate insulating layer 402 may be formed with a sputtering apparatus where deposition is performed with surfaces of a plurality of substrates set substantially perpendicular to a surface of a sputtering target.

The gate insulating layer 402 can be made of silicon oxide, gallium oxide, aluminum oxide, silicon nitride, silicon oxynitride, aluminum oxynitride, silicon nitride oxide, or the like. It is preferable that a part of the gate insulating layer 402 which is in contact with the oxide semiconductor layer 403 include oxygen. In particular, the gate insulating layer 402 preferably contains, in the film (bulk), oxygen the proportion of which is higher than the stoichiometric proportion. For example, in the case where a silicon oxide film is used as the gate insulating layer 402, the composition formula is preferably $SiO_{2+\alpha}$ ($\alpha>0$). In this embodiment, a silicon oxide film of $SiO_{2+\alpha}$ ($\alpha>0$) is used as the gate insulating layer 402. By using the silicon oxide film as the gate insulating layer 402, oxygen can be supplied to the oxide semiconductor layer 403, so that favorable characteristics can be obtained.

The gate insulating layer 402 can also be formed using a high-k material such as hafnium oxide, yttrium oxide, hafnium silicate, hafnium silicate to which nitrogen is added, hafnium aluminate, or lanthanum oxide, leading to a reduction in gate leakage current. The gate insulating layer 402 may have either a single-layer structure or a stacked structure.

Further, similarly to the base insulating layer 436, the gate insulating layer 402 preferably includes an oxygen-excess region because oxygen vacancies in the oxide semiconductor layer 403 can be filled with the excess oxygen contained in the gate insulating layer 402. In the case where the gate insulating layer 402 has a stacked structure, an oxygen-excess region is preferably provided at least in a layer in contact with the oxide semiconductor layer 403. In order to provide the oxygen-excess region in the gate insulating layer 402, for example, the gate insulating layer 402 may be formed in an oxygen atmosphere. Alternatively, the oxygen-excess region may be formed by introduction of oxygen (including at least one of an oxygen radical, an oxygen atom, and an oxygen ion) into the gate insulating layer 402 after its formation. Oxygen can be introduced by an ion implantation method, an ion doping method, a plasma immersion ion implantation method, plasma treatment, or the like.

Note that in the case where oxygen is introduced into the formed gate insulating layer 402, oxygen may also be introduced into the oxide semiconductor layer 403 by the oxygen introduction treatment. Heat treatment is preferably performed after oxygen is introduced into the gate insulating layer 402. The heat treatment can be performed at a temperature, for example, higher than or equal to 300° C. and lower than or equal to 450° C. Note that the heat treatment can also serve as dehydration treatment or dehydrogenation treatment on the oxide semiconductor layer 403.

The introduction of oxygen into the gate insulating layer 402 can be performed anytime after the formation of the gate insulating layer 402. A plurality of oxygen introduction methods can be used in combination. For example, after the formation of the gate insulating layer 402, oxygen may be introduced by an ion implantation method and plasma treatment and heat treatment may be performed. Alternatively, it is possible to introduce oxygen by plasma treatment after the formation of the gate insulating layer 402, introduce oxygen again by an ion implantation method in a later step after formation of the insulating layer 406, and perform heat treatment; the order of plasma treatment and ion implantation treatment may be changed.

Next, the gate electrode layer 401 is formed over the island-like oxide semiconductor layer 403 with the gate insulating layer 402 interposed therebetween. The gate electrode layer 401 can be formed by a plasma CVD method, a sputtering method, or the like. Further, the gate electrode layer 401 can be made using a metal film containing an element selected from molybdenum, titanium, tantalum, tungsten, aluminum, copper, chromium, neodymium, and scandium; a metal nitride film containing any of the above elements as its component (a titanium nitride film, a molybdenum nitride film, or a tungsten nitride film); or the like. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked structure.

The gate electrode layer 401 can also be made of a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 have a stacked structure of the above conductive material and the above metal material.

As one layer of the gate electrode layer 401 which is in contact with the gate insulating layer 402, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function of 5 eV (electron volt) or higher, preferably 5.5 eV (electron volt) or higher, and the use of this film as the gate electrode layer enables the threshold voltage of a transistor to be shifted to the positive side. Accordingly, a so-called normally-off switching element can be obtained.

Note that the gate electrode layer 401 can be formed by processing a conductive film (not illustrated) provided over the gate insulating layer 402 with use of a mask. Here, as the mask used for the processing, a mask having a finer pattern which is formed by performing a slimming process on a mask formed by a photolithography method or the like is preferably used.

As the slimming process, an ashing process employing oxygen in a radical state (an oxygen radical) or the like can be employed, for example. Note that the slimming process is not limited to the ashing process as long as the mask formed by a photolithography method or the like can be processed into a finer pattern. Since the channel length (L) of a transistor is determined by the mask formed by the slimming process, the slimming process preferably has high controllability.

As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, and more preferably less than or equal to one third of the resolution limit of the light exposure apparatus. For example, the line width can become greater than or equal to 30 nm and less than or equal to 2000 nm, preferably greater than or equal to 50 nm and less than or equal to 350 nm. This enables further miniaturization of the transistor.

Next, a dopant 431 is introduced into the oxide semiconductor layer 403 by using the gate electrode layer 401 as a mask, whereby the impurity region 403a and the impurity region 403b are formed. By the introduction of the dopant 431, the oxide semiconductor layer 403 in which the channel region 403c is sandwiched between the pair of impurity regions is formed (see FIG. 2C).

The dopant 431 can be introduced by an ion implantation method, an ion doping method, a plasma immersion ion implantation method, or the like. In that case, it is preferable to use a single ion of the dopant 431 or a fluoride ion or a chloride ion thereof.

The introduction of the dopant 431 can be controlled by setting as appropriate the implantation conditions such as the accelerated voltage and the dosage, or the thickness of the film through which the dopant 431 passes. The dosage of the dopant 431 can be set to, for example, greater than or equal to $1 \times 10^{13}$ ions/cm$^2$ and less than or equal to $5 \times 10^{16}$ ions/cm$^2$. The concentration of the dopant 431 in the impurity regions is preferably greater than or equal to $5 \times 10^{18}$/cm$^3$ and less than or equal to $1 \times 10^{22}$/cm$^3$.

The dopant 431 may be introduced while the substrate 400 is heated.

The introduction of the dopant 431 into the oxide semiconductor layer 403 may be performed plural times, and plural kinds of dopants may be used.

Further, heat treatment may be performed after the introduction of the dopant 431. The heat treatment is preferably performed at a temperature higher than or equal to 300° C. and lower than or equal to 700° C., more preferably higher than or equal to 300° C. and lower than or equal to 450° C., in an oxygen atmosphere for one hour. The heat treatment may be performed in a nitrogen atmosphere, reduced pressure, or the air (ultra-dry air).

Figure 3A:
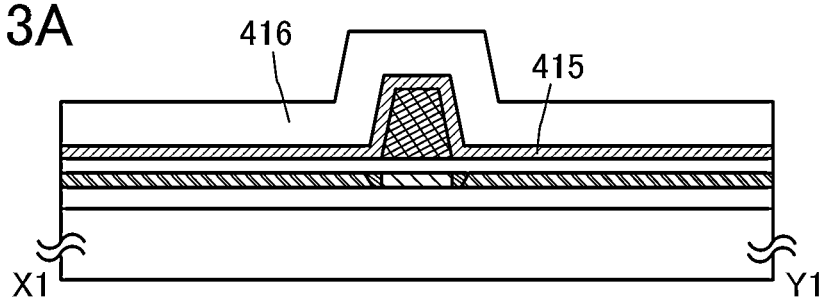
FIGS. 3A to 3D illustrate an example of a method for manufacturing a semiconductor device.

Next, a conductive film 415 is formed over the gate electrode layer 401 and the gate insulating layer 402, and an insulating layer 416 is formed over the conductive film 415 (see FIG. 3A).

The conductive film 415 can be formed using a material similar to that of the gate electrode layer 401 and is preferably formed by a sputtering method. The thickness of the conductive film 415 is preferably greater than or equal to 10 nm and less than or equal to 50 nm, for example.

The insulating layer 416 can be made of silicon oxide, silicon nitride, silicon oxynitride, or silicon nitride oxide, for example, and is preferably formed by a CVD method.

In general, step coverage is poor in a sputtering method as compared to a CVD method. Thus, in the case where a conductive film having a large thickness is formed in contact with the gate electrode layer 401 and is anisotropically etched so that a conductive layer in contact with a sidewall of the gate electrode layer 401 is formed in a self-aligned manner, a step (a boundary between the region in contact with the gate insulating layer 402 and the region in contact with the gate electrode layer 401) may have a low-density portion, in some cases. The low-density portion in the conductive layer serving as a part of the gate electrode layer can cause occurrence of leakage current.

However, in this embodiment, the conductive film 415 having a small thickness is formed to cover the gate electrode layer 401, then the insulating layer 416 touching the conductive film 415 is formed by a CVD method by which good step coverage is obtained. Thus, the gate electrode layer 401 can be covered with the conductive film 415 with good film quality.

Although the edge of the gate electrode layer 401 is tapered in this embodiment, an embodiment of the present invention is not limited thereto. Note that it is preferable that the gate electrode layer 401 be tapered because the conductive film 415 can be easily formed with good step coverage.

Figure 3B:
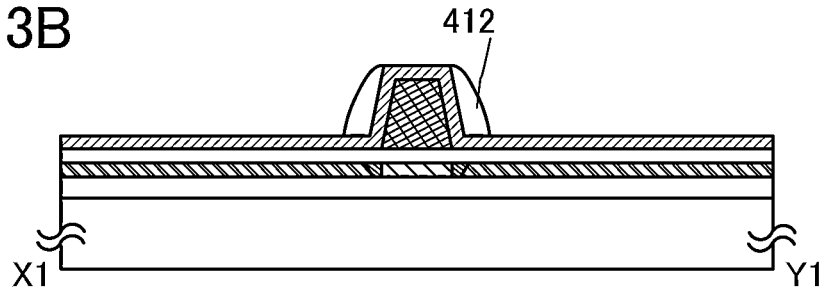

Next, the insulating layer 416 is anisotropically etched to form the sidewall insulating layer 412 (see FIG. 3B).

Figure 3C:
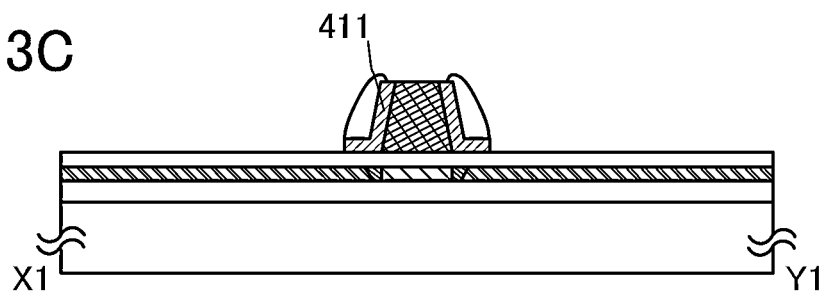

Then, the conductive film 415 is etched with the sidewall insulating layer 412 used as a mask, whereby the conductive layer 411 is formed in contact with the side surface of the gate electrode layer 401 (see FIG. 3C).

After that, the insulating layer 406 and the insulating layer 407 are formed over the gate insulating layer 402, the gate electrode layer 401, and the sidewall insulating layer 412. Note that in this embodiment, a stack of the insulating layer 406 and the insulating layer 407 is formed over the gate insulating layer 402, the gate electrode layer 401, and the sidewall insulating layer 412; an embodiment of the present invention is not limited thereto. A single insulating layer may be provided, or a stack of three or more insulating layers may be provided.

The insulating layer 406 or the insulating layer 407 can be formed by a plasma CVD method, a sputtering method, an evaporation method, or the like. In particular, the insulating layer 406 or the insulating layer 407 is preferably formed using, as appropriate, a method such as a sputtering method which prevents an impurity such as water or hydrogen from entering the insulating layer 406 or the insulating layer 407. As the insulating layer 406 or the insulating layer 407, an inorganic insulating film such as a silicon oxide film, a silicon oxynitride film, an aluminum oxynitride film, or a gallium oxide film, or the like can be typically used.

As the insulating layer 406 or the insulating layer 407, an aluminum oxide film, a hafnium oxide film, a magnesium oxide film, a zirconium oxide film, a lanthanum oxide film, a barium oxide film, or a metal nitride film (e.g., an aluminum nitride film) can also be used.

Note that an aluminum oxide film is preferably provided as the insulating layer 406 or the insulating layer 407. The aluminum oxide film can be preferably applied because of a high shielding effect (blocking effect) which enables impermeability of both oxygen and impurities such as hydrogen and moisture; and in and after the manufacturing process, the aluminum oxide film functions as a protective film for preventing entry of impurities such as hydrogen and moisture, which cause a change in the characteristics of a transistor, into the oxide semiconductor layer 403 and release of oxygen, which is a main constituent material of the oxide semiconductor, from the oxide semiconductor layer 403.

In order to remove residual moisture from the deposition chamber for depositing the insulating layer 406 or the insulating layer 407 in a manner similar to that of the formation of the oxide semiconductor layer 403, an entrapment vacuum pump (such as a cryopump) is preferably used. When the insulating layer 406 or the insulating layer 407 is deposited in the deposition chamber evacuated using a cryopump, the impurity concentration of the insulating layer 406 or the insulating layer 407 can be reduced. As an evacuation unit for removing moisture remaining in the deposition chamber for depositing the insulating layer 406 or the insulating layer 407, a turbo molecular pump provided with a cold trap may also be used.

In this embodiment, an aluminum oxide film is formed as the insulating layer 406 and a silicon oxide film is formed as the insulating layer 407. Note that when the aluminum oxide film has high density (film density of 3.2 g/cm$^3$ or higher, preferably 3.6 g/cm$^3$ or higher), the transistor 420 can have stable electrical characteristics. The film density can be measured by Rutherford backscattering spectrometry (RBS) or X-ray reflection (XRR).

In the case where an aluminum oxide film is formed as the insulating layer 406, heat treatment is preferably performed after the formation of the aluminum oxide film. The aluminum oxide film has a function of preventing entry of water (and/or hydrogen) to the oxide semiconductor layer and a function of preventing release of oxygen from the oxide semiconductor layer. Thus, when the oxide semiconductor layer 403 and/or the insulating layer in contact therewith include(s) an oxygen-excess region, at least one oxygen-excess region can be provided in the film (bulk) of the oxide semiconductor layer or at the interface between the insulating layer and the oxide semiconductor layer by performing heat treatment in a state where the aluminum oxide film is provided.

Figure 3D:
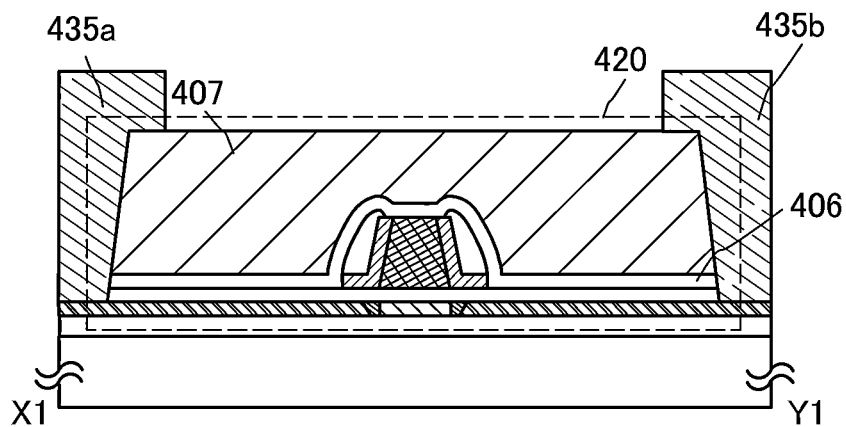

Next, openings reaching the source electrode layer 405a or the drain electrode layer 405b are formed in the insulating layer 407, the insulating layer 406, and the gate insulating layer 402, and the wiring layer 435a and the wiring layer 435b are formed in the openings (see FIG. 3D). With the use of the wiring layers 435a and 435b, the transistor is connected to another transistor or another element, which can lead to formation of a variety of circuits.

The wiring layer 435a and the wiring layer 435b can be formed using a material and a method similar to those of the gate electrode layer 401, the conductive layer 411, the source electrode layer 405a, or the drain electrode layer 405b. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Further, a film of a high-melting-point metal such as Ti, Mo, or W or a metal nitride film of any of these elements (a titanium nitride film, a molybdenum nitride film, or a tungsten nitride film) may be stacked on one or both of a bottom side and a top side of a metal film of Al, Cu, or the like. Alternatively, the conductive film used for the wiring layer 435a and the wiring layer 435b may be formed of a conductive metal oxide. As the conductive metal oxide, indium oxide ($In_2O_3$), tin oxide ($SnO_2$), zinc oxide (ZnO), ITO, indium oxide-zinc oxide ($In_2O_3$—ZnO), or any of these metal oxide materials containing silicon oxide can be used.

For example, as the wiring layers 435a and 435b, a single-layer molybdenum film, a stack of a tantalum nitride film and a copper film, or a stack of a tantalum nitride film and a tungsten film can be used.

Through the above process, the transistor 420 of this embodiment is formed.

Note that in the above transistor 420, the sidewall insulating layer 412 is in contact with a part of the top surface of the conductive layer 411; however, an embodiment of the present invention is not limited thereto. The size of the sidewall insulating layer 412 (the length in the channel length direction or the film thickness of the sidewall insulating layer) can be set as appropriate by controlling the etching treatment of the insulating layer 416.

Figure 4A:
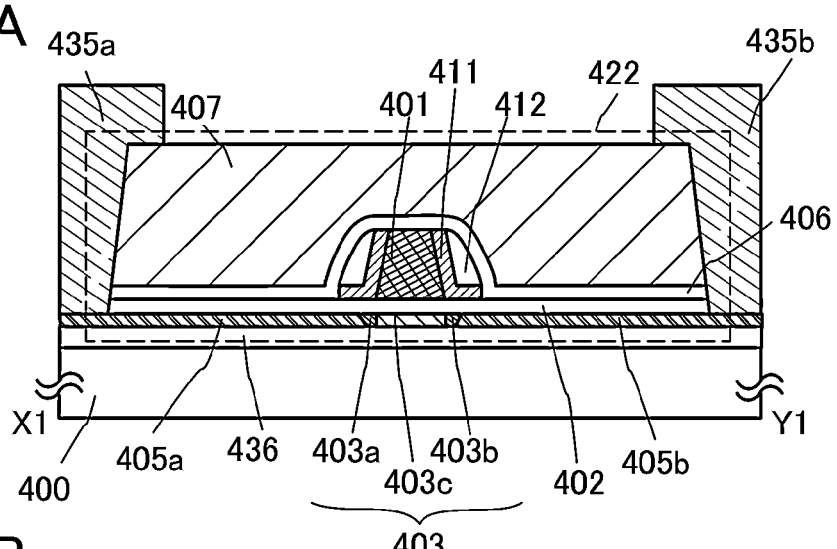
FIGS. 4A to 4C are cross-sectional views each illustrating one embodiment of a semiconductor device.

For example, like in a transistor 422 illustrated in FIG. 4A, the height of the sidewall insulating layer 412 (the distance from the surface of the substrate 400 to the upper surface of the sidewall insulating layer 412) may be equal to the height of the conductive layer 411 (the distance from the surface of the substrate 400 to the upper surface of the conductive layer 411). Alternatively, like in a transistor 424 illustrated in FIG. 4B, the height of the sidewall insulating layer 412 (the distance from the surface of the substrate 400 to the upper surface of the sidewall insulating layer 412) may be lower than that of the conductive layer 411 (the distance from the surface of the substrate 400 to the upper surface of the conductive layer 411). In the transistor 424, the upper end of the sidewall insulating layer 412 is in contact with the side surface of the conductive layer 411. Note that the transistor 422 and the transistor 424 illustrated in FIGS. 4A and 4B can have a structure similar to that of the transistor 420 illustrated in FIGS. 1A and 1B except for the size of the sidewall insulating layer 412.

Further, when the gate electrode layer 401 is patterned and/or when the conductive film 415 is etched with the sidewall insulating layer used as a mask, a part of the gate insulating layer 402 is etched in some cases depending on the conditions of etching treatment.

Figure 4B:
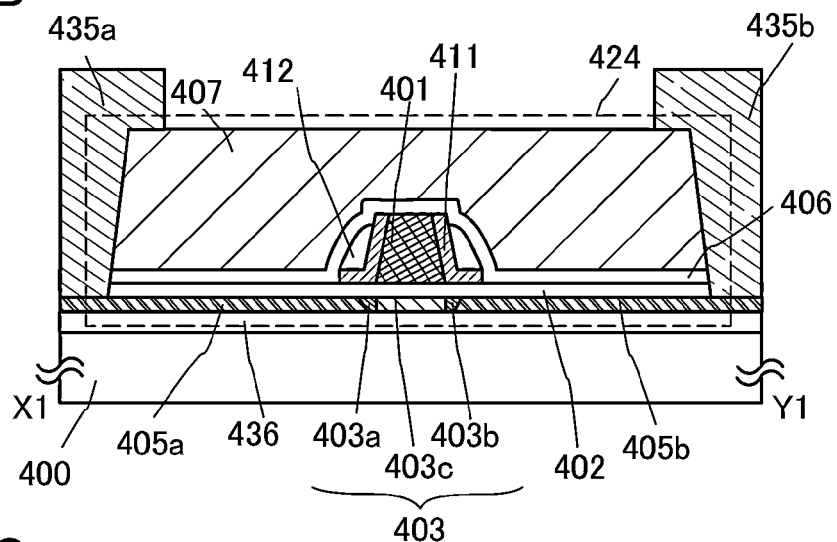
Figure 4C:
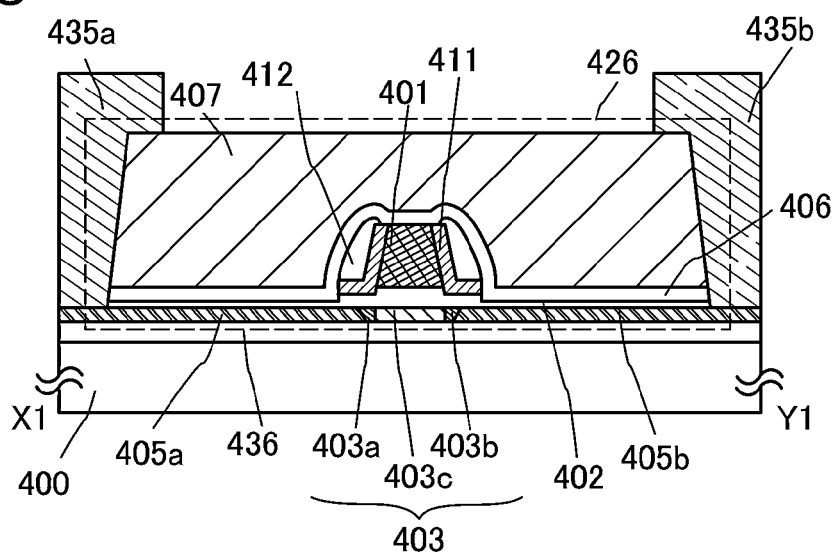

For example, the transistor 426 illustrated in FIG. 4C shows an example in which the thickness of the gate insulating layer 402 is reduced in the etching treatment for forming the gate electrode layer 401 and in the etching treatment for forming the conductive layer 411. In the transistor 426, the thickness of the gate insulating layer 402 overlapping with the gate electrode layer 401 is larger than that of the gate insulating layer 402 overlapping with the conductive layer 411. Further, the thickness of the gate insulating layer 402 overlapping with the conductive layer 411 is larger than that of the gate insulating layer 402 overlapping with neither the conductive layer 411 nor the gate electrode layer 401.

Note that this embodiment is not limited to the above structure. For example, in some cases, the thickness of a part of the gate insulating layer 402 (which does not overlap with the gate electrode layer 401) is reduced by the etching treatment for forming the gate electrode layer 401 while the thickness of the gate insulating layer 402 is not reduced by the etching treatment for forming the conductive layer 411.

The transistor shown in this embodiment includes the oxide semiconductor layer 403 having a pair of impurity regions and a channel region, and the source electrode layer 405a and the drain electrode layer 405b which are in contact with side surfaces of the oxide semiconductor layer 403 in the impurity region in the channel length direction. Accordingly, the contact resistance between the oxide semiconductor layer 403 and the source electrode layer 405a or the drain electrode layer 405b can be reduced, and on-state characteristics (e.g., on-state current and field-effect mobility), operation speed, and response speed of the transistor can be increased.

In addition, since a dopant is introduced with the gate electrode layer 401 used as a mask, the length of the channel region 403c can be reduced while the length of the island-like oxide semiconductor layer 403 in the channel length direction is maintained to such a level that the alignment accuracy of the gate electrode layer 401 can be maintained. Accordingly, the miniaturized transistor 420 can be provided with high yield.

Further, the island-like oxide semiconductor layer 403 is formed without etching treatment using a resist mask, which allows precise processing to be performed accurately even in the case where the distance between the source electrode layer 405a and the drain electrode layer 405b is reduced. Thus, in the manufacturing process of the semiconductor device, the miniaturized transistor 420 with little variation in shape and characteristics can be manufactured with high yield.

The semiconductor device of this embodiment includes the conductive layer 411 on the side surface of the gate electrode layer 401; accordingly, the conductive layer 411 overlaps with the source electrode layer 405a and the drain electrode layer 405b with the gate insulating layer 402 interposed therebetween in the channel direction. Thus, it is possible to provide a transistor having an Lov region and suppress a decrease in the on-state current of the transistor.

In the semiconductor device of this embodiment, the side surfaces of the oxide semiconductor layer 403 in the channel length direction are covered with wirings, namely, the source electrode layer 405a and the drain electrode layer 405b, whereby light is prevented from entering the oxide semiconductor layer through the side surfaces. Further, entry of light from above into the oxide semiconductor layer 403 is prevented by the gate electrode layer 401 and the conductive layer 411 which are provided over the oxide semiconductor layer 403 with the gate insulating layer 402 interposed therebetween. Thus, photodegradation of the oxide semiconductor layer can be suppressed, resulting in high reliability of the semiconductor device.

In the manufacturing process, the conductive layer 411 is formed in such a manner that the insulating layer 416 provided over the gate electrode layer 401 with the conductive film 415 interposed therebetween is processed into the sidewall insulating layer 412 in a self-aligned manner, then the conductive film 415 is etched with the sidewall insulating layer 412 used as a mask. That is, the conductive layer 411 is formed without an etching step using a resist mask, which allows precise processing to be performed accurately. Thus, in the manufacturing process of the semiconductor device, the miniaturized transistor with little variation in shape and characteristics can be manufactured with high yield.

The structures, methods, and the like shown in this embodiment can be combined as appropriate with the structures, methods, and the like shown in the other embodiments.

Embodiment 2

A semiconductor device with a display function (also referred to as a display device) can be manufactured using the transistor described in the above embodiment. Moreover, some or all of the driver circuits which include the transistor can be formed over a substrate where the pixel portion is formed, whereby a system-on-panel can be obtained.

Figure 5A:
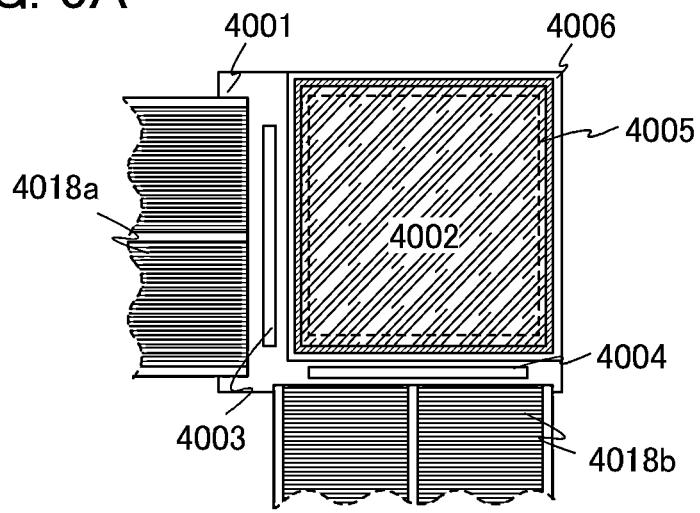
FIGS. 5A to 5C are top views illustrating one embodiment of a semiconductor device.

In FIG. 5A, a sealant 4005 is provided to surround a pixel portion 4002 provided over a first substrate 4001, and the pixel portion 4002 is sealed with the sealant 4005 and the second substrate 4006. In FIG. 5A, a scan line driver circuit 4004 and a signal line driver circuit 4003 each are formed using a single crystal semiconductor film or a polycrystalline semiconductor film over a substrate prepared separately, and mounted in a region different from the region surrounded by the sealant 4005 over the first substrate 4001. A variety of signals and potentials are supplied from flexible printed circuits (FPCs) 4018a and 4018b to the pixel portion 4002 through the signal line driver circuit 4003 and the scan line driver circuit 4004.

Figure 5B:
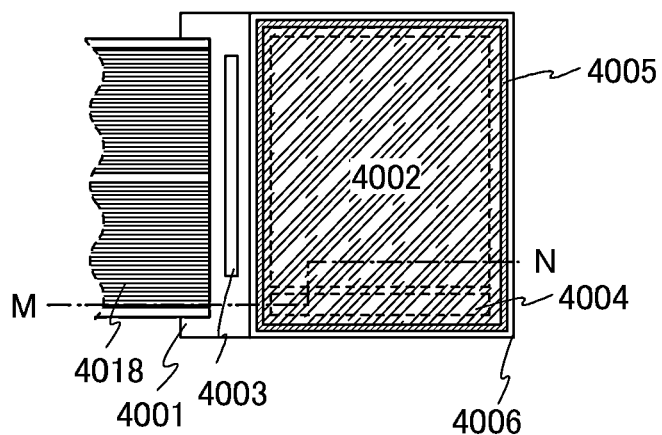
Figure 5C:
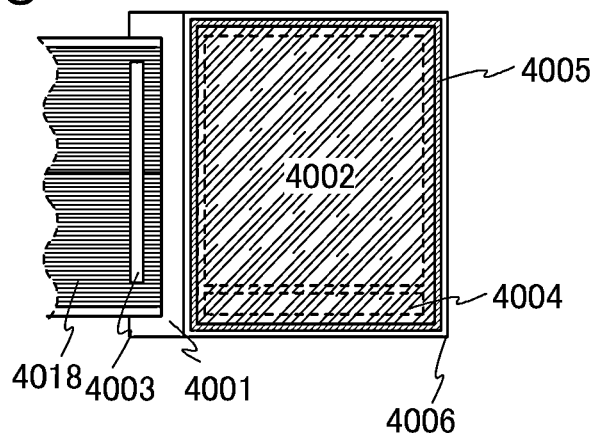

In FIGS. 5B and 5C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 5B and 5C, the signal line driver circuit 4003 is formed using a single crystal semiconductor film or a polycrystalline semiconductor film over a substrate prepared separately, and mounted in a region different from the region surrounded by the sealant 4005 over the first substrate 4001. In FIGS. 5B and 5C, a variety of signals and potentials are supplied from an FPC 4018 to the pixel portion 4002 through the signal line driver circuit 4003 and the scan line driver circuit 4004.

Although FIGS. 5B and 5C each show an example in which the signal line driver circuit 4003 is formed separately and mounted on the first substrate 4001, one embodiment of the present invention is not limited to this structure. The scan line driver circuit may be formed separately and then mounted, or only a part of the signal line driver circuit or a part of the scan line driver circuit may be formed separately and then mounted.

Note that a connection method of a separately formed driver circuit is not particularly limited, and a chip on glass (COG) method, a wire bonding method, a tape automated bonding (TAB) method, or the like can be used. FIG. 5A shows an example in which the signal line driver circuit 4003 and the scan line driver circuit 4004 are mounted by a COG method. FIG. 5B shows an example in which the signal line driver circuit 4003 is mounted by a COG method. FIG. 5C illustrates an example in which the signal line driver circuit 4003 is mounted by a TAB method.

Note that the display device includes a panel in which the display element is sealed, and a module in which an IC including a controller or the like is mounted on the panel. A display device in this specification means an image display device, a display device, or a light source (including a lighting device). Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit which are provided over the first substrate include a plurality of transistors, to which the transistor described in the above embodiment can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 6A:
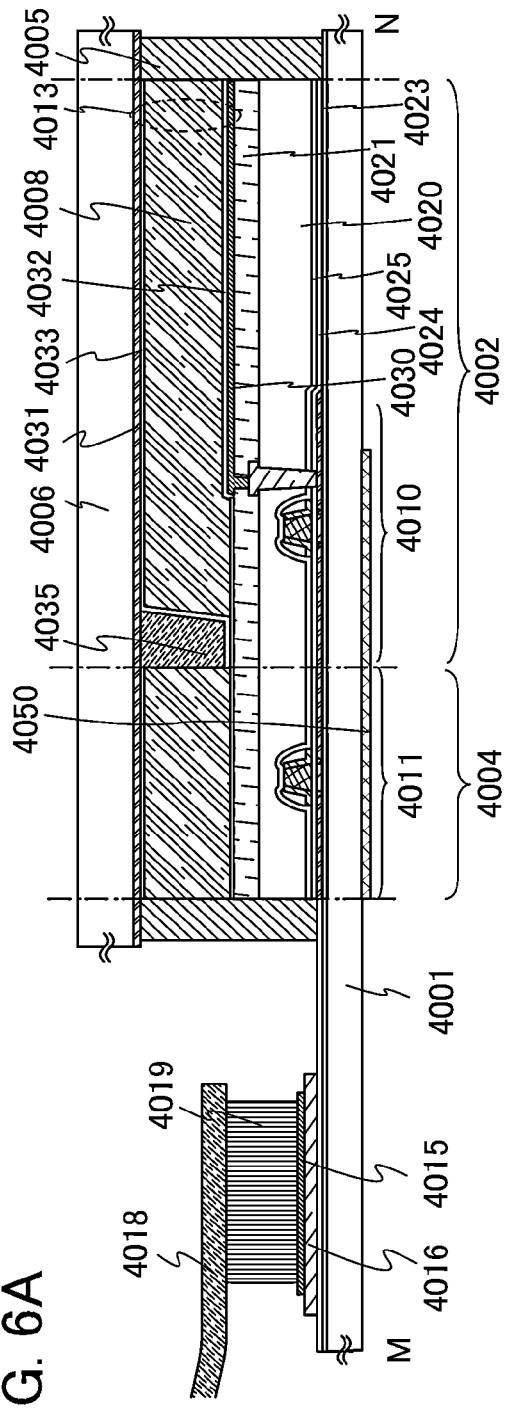
FIGS. 6A and 6B are cross-sectional views each illustrating one embodiment of a semiconductor device.
Figure 6B:
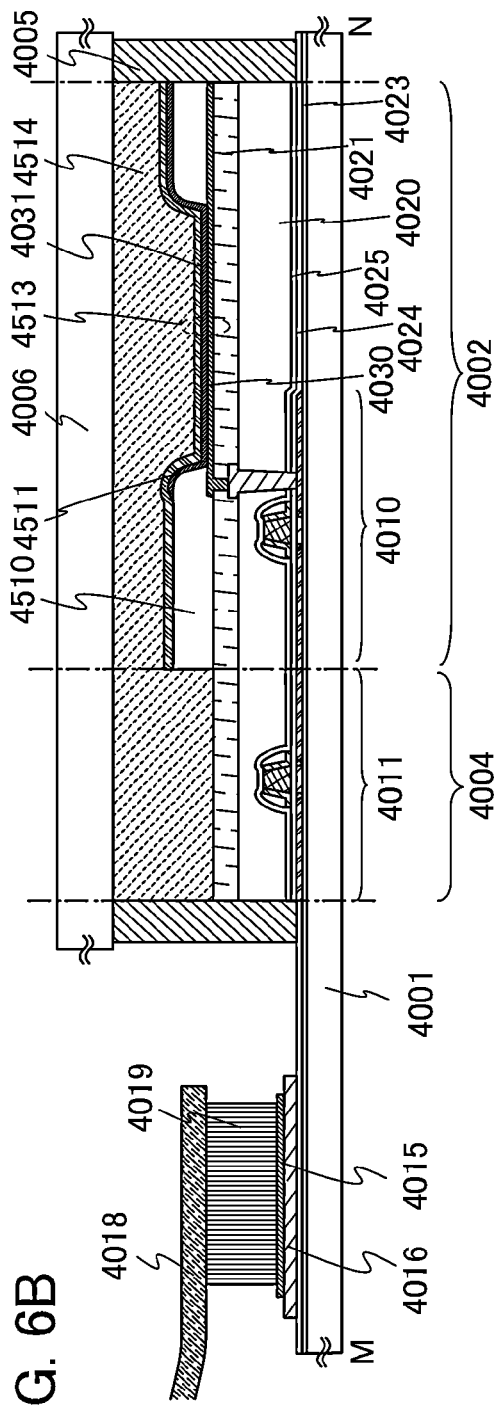

Embodiments of the semiconductor device will be described with reference to FIGS. 5A to 5C and FIGS. 6A and 6B. FIGS. 6 and 6B are cross-sectional views along line M-N in FIG. 5B.

As shown in FIGS. 6A and 6B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030. The terminal electrode 4016 is formed using the same conductive film as source and drain wiring layers of transistors 4010 and 4011.

Each of the pixel portion 4002 and the scan line driver circuit 4004 which are provided over the first substrate 4001 includes a plurality of transistors. In FIGS. 6A and 6B, the transistor 4010 included in the pixel portion 4002 and the transistor 4011 included in the scan line driver circuit 4004 are illustrated as an example. In FIGS. 6A and 6B, insulating films 4024 and 4025, an interlayer insulating film 4020, and an insulating film 4021 are provided over the transistors 4010 and 4011. Note that an insulating film 4023 serves as a base film. In the case where the pixel portion 4002 and the scan line driver circuit 4004 are not provided over one substrate, the first electrode layer 4030 can be directly connected to the transistor 4010 without providing the interlayer insulating film 4020 and the insulating film 4021.

The transistor described in Embodiment 1 can be applied to the transistor 4010 and the transistor 4011. This embodiment shows an example of using a transistor having a structure similar to that of the transistor 420 described in Embodiment 1.

In the transistor 4010 and the transistor 4011, the side surfaces of an oxide semiconductor layer in the channel length direction are covered with a source electrode layer and a drain electrode layer, whereby light is prevented from entering the oxide semiconductor layer through the side surfaces. Further, entry of light from above into the oxide semiconductor layer is prevented by a gate electrode layer and a conductive layer provided on a side surface of the gate electrode layer in the channel length direction. In other words, the source electrode layer, the drain electrode layer, the gate electrode layer, and the conductive layer on the side surface of the gate electrode layer also function as light-blocking films. Thus, photodegradation of the oxide semiconductor layer can be suppressed, resulting in a reduction in the amount of change in the threshold voltage of the transistors 4010 and 4011 before and after a bias-temperature stress test (a BT test), and highly reliable semiconductor devices can be provided as the semiconductor devices of this embodiment illustrated in FIGS. 5A to 5C and FIGS. 6A and 6B.

In FIG. 6A, a light-blocking film 4050 is provided in a region which overlaps with the transistors 4010 and 4011. The light-blocking film 4050 prevents light from below (such as light of a backlight) from entering the oxide semiconductor layer, resulting in an improvement in the reliability of the semiconductor device.

The transistor 4010 included in the pixel portion 4002 is electrically connected to a display element to form a display panel. There is no particular limitation on the kind of the display element as long as an image can be displayed, and various kinds of display elements can be employed.

FIG. 6A illustrates an example of a liquid crystal display device using a liquid crystal element as a display element. In FIG. 6A, a liquid crystal element 4013 as a display element includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A columnar spacer 4035, which is obtained by selective etching of an insulating film, is provided in order to control the thickness (cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In that case, the liquid crystal layer 4008 is in contact with the first electrode layer 4030 and the second electrode layer 4031. A blue phase is one of the liquid crystal phases, which appears just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor using an oxide semiconductor layer has a possibility that the electrical characteristics of the transistor may fluctuate significantly by the influence of static electricity and deviate from the designed range. Therefore, it is more effective to use a liquid crystal composition exhibiting a blue phase for the liquid crystal display device including the transistor formed using an oxide semiconductor layer.

The specific resistivity of the liquid crystal material is $1\times10^9$ Ω·cm or more, preferably $1\times10^{11}$ Ω·cm or more, and further preferably $1\times10^{12}$ Ω·cm or more. Note that the specific resistivity in this specification is measured at 20° C.

The size of a storage capacitor formed in the liquid crystal display device is set considering, for example, the leakage current of the transistor provided in the pixel portion so that charge can be held for a predetermined period. The size of the storage capacitor may be set considering, for example, the off-state current of the transistor.

In the transistor used in this embodiment, which includes an oxide semiconductor layer, the current in an off state (off-state current) can be made small. Accordingly, an electric signal such as an image signal can be held for a longer period, and a writing interval can be set longer in an on state. Accordingly, the frequency of refresh operation can be reduced, which leads to an effect of suppressing power consumption.

The transistor used in this embodiment, which includes an oxide semiconductor layer, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the disclosed invention is not limited to the application to a display device for color display; one embodiment of the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that described here is an example of using an organic EL element as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

FIG. 6B shows an example of a light-emitting device (light-emitting panel) including a light-emitting element as a display element. A light-emitting element 4513 which is a display element is electrically connected to the transistor 4010 provided in the pixel portion 4002. A structure of the light-emitting element 4513 is not limited to the illustrated stacked structure including the first electrode layer 4030, an electroluminescent layer 4511, and the second electrode layer 4031. The structure of the light-emitting element 4513 can be changed as appropriate depending on, for example, the direction in which light is extracted from the light-emitting element 4513.

A partition wall 4510 is made of an organic insulating material or an inorganic insulating material. It is particularly preferable that the partition wall 4510 be made of a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. In this manner, the light-emitting device is preferably packaged (sealed) with a protective film (such as a laminate film or an ultraviolet curable resin film) or a cover material with high air-tightness and little degasification so that the light-emitting device is not exposed to the outside air.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, it is possible to perform anti-glare treatment by which reflected light can be diffused by projections and depressions on the surface so as to reduce the glare.

Further, electronic paper in which electronic ink is driven can be provided as the display device. The electronic paper is also referred to as an electrophoretic display device (an electrophoretic display) and has the following advantages: the same level of readability as plain paper; low power consumption as compared to other display devices; and thin and light shape which can be obtained.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

Note that in FIGS. 5A to 5C and FIGS. 6A and 6B, a flexible substrate as well as a glass substrate can be used as the first substrate 4001 and the second substrate 4006. For example, a plastic substrate having a light-transmitting property can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

An oxide insulating film can be used as the interlayer insulating film 4020, and the interlayer insulating film 4020 can be formed by a plasma CVD method, a sputtering method, or the like, using silicon oxide, silicon oxynitride, aluminum oxide, aluminum oxynitride, hafnium oxide, gallium oxide, or a mixed material of any of these materials. Further, a nitride insulating film may be stacked over the oxide insulating film, and the nitride insulating film can be formed using any of silicon nitride, silicon nitride oxide, aluminum nitride, aluminum nitride oxide, and a mixed material of any of these.

Note that an aluminum oxide film is preferably used as a protective film for covering the transistors 4010 and 4011. The protective film can be formed by a sputtering method or a plasma CVD method.

The aluminum oxide film provided as the protective film over the oxide semiconductor layer has a high shielding effect (blocking effect) of preventing penetration of both oxygen and impurities such as hydrogen and moisture.

Therefore, in and after the manufacturing process, the aluminum oxide film functions as a protective film for preventing entry of impurities such as hydrogen or moisture, which can cause variation, into the oxide semiconductor layer and release of oxygen, which is a main component material of the oxide semiconductor layer, from the oxide semiconductor layer.

The insulating film 4021 serving as a planarization insulating film can be made of an organic material having heat resistance, such as an acrylic-, polyimide-, or benzocyclobutene-based resin, polyamide, or epoxy. Other than such organic materials, it is also possible to use a low-dielectric constant material (a low-k material), a siloxane-based resin, phosphosilicate glass (PSG), borophosphosilicate glass (BPSG), or the like. The insulating film may be formed by stacking a plurality of insulating films made of these materials.

There is no particular limitation on the method for forming the insulating film 4021, and the following method or tool (equipment) can be used depending on the material: a sputtering method, an SOG method, spin coating, dipping, spray coating, a droplet discharge method (such as an inkjet method), screen printing, offset printing, a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible light wavelength range.

The first electrode layer and the second electrode layer (also referred to as a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy thereof; and a nitride thereof.

A conductive composition containing a conductive high molecule (also referred to as conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

In the semiconductor device shown in this embodiment, the oxide semiconductor layer and the conductive layer on the side surface of the gate electrode layer in the channel length direction are formed by patterning without a photolithography step, which allows a reduction in the number of masks used for manufacturing the semiconductor device. As a result, reduction in the manufacturing cost and increase in the yield of the semiconductor device can be realized. Furthermore, a large substrate can be used.

Since the semiconductor device shown in this embodiment includes the miniaturized transistor, high definition images can be displayed while maintaining a high aperture ratio.

By thus using the transistor described in the above embodiment, the semiconductor device having a variety of functions can be provided.

This embodiment can be implemented in appropriate combination with the structures described in the other embodiments.

Embodiment 3

A semiconductor device having an image sensor function for reading data of an object can be formed using the transistor described in Embodiment 1.

FIG. 7A shows an example of a semiconductor device having an image sensor function. FIG. 7A is an equivalent circuit of a photosensor, and FIG. 7B is a cross-sectional view illustrating a part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photosensor output signal line 671.

Note that in the circuit diagram in this specification, a transistor including an oxide semiconductor layer is denoted by a symbol "OS" so that it can be identified as a transistor formed using an oxide semiconductor layer. In FIG. 7A, the transistor 640 and the transistor 656 are each a transistor including an oxide semiconductor layer, to which the transistors described in the above embodiments can be applied. This embodiment shows an example of using a transistor having a structure similar to that of the transistor 420 described in Embodiment 1.

FIG. 7B is a cross-sectional view of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with an adhesive layer 608 interposed therebetween.

An interlayer insulating film 632, an insulating film 633, and an interlayer insulating film 634 are provided over the transistor 640 formed over an insulating film 631. The photodiode 602 is provided over the insulating film 633. In the photodiode 602, a first semiconductor film 606a, a second semiconductor film 606b, and a third semiconductor film 606c are sequentially stacked from the insulating film 633 side, between electrode layers 641a and 641b formed over the insulating film 633 and an electrode layer 642 formed over the interlayer insulating film 634.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to a gate electrode layer of the transistor 640, and the photodiode 602 is electrically connected to the transistor 640.

Here, a pin photodiode is illustrated as an example, in the pin photodiode, a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, after an amorphous silicon film which does not contain an impurity element is formed, an impurity element may be introduced into the amorphous silicon film by a diffusion method or an ion implantation method. Heating or the like may be conducted after introducing the impurity element by an ion implantation method or the like in order to diffuse the impurity element. In this case, an LPCVD method, a vapor deposition method, a sputtering method, or the like may be used as a method for forming the amorphous silicon film. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane (SiH$_4$) may be used. Alternatively, Si$_2$H$_6$, SiH$_2$Cl$_2$, SiHCl$_3$, SiCl$_4$, SiF$_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, after an amorphous silicon film which does not contain an impurity element is formed, an impurity element may be introduced into the amorphous silicon film by a diffusion method or an ion implantation method. Heating or the like may be conducted after introducing the impurity element by an ion implantation method or the like in order to diffuse the impurity element. In this case, an LPCVD method, a vapor deposition method, a sputtering method, or the like may be used as a method of forming the amorphous silicon film. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The microcrystalline semiconductor belongs to a metastable state of an intermediate between amorphous and single crystalline when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wavenumbers than 520 cm$^{-1}$, which represents a peak of the Raman spectrum of single crystal silicon. That is, the peak of the Raman spectrum of microcrystalline silicon exists between 520 cm$^{-1}$ which represents single crystal silicon and 480 cm$^{-1}$ which represents amorphous silicon. In addition, microcrystalline silicon contains at least 1 at.% or more of hydrogen or halogen in order to terminate a dangling bond. Moreover, microcrystalline silicon contains a rare gas element such as helium, argon, krypton, or neon to further promote lattice distortion, so that stability is increased and a favorable microcrystalline semiconductor film can be obtained.

This microcrystalline semiconductor film can be formed by a high-frequency plasma CVD method with a frequency of several tens of megahertz to several hundreds of megahertz or using a microwave plasma CVD apparatus with a frequency of 1 GHz or higher. The microcrystalline semiconductor film can be typically formed using a dilution of a compound containing silicon such as SiH$_4$, Si$_2$H$_6$, SiH$_2$Cl$_2$, SiHCl$_3$, SiCl$_4$, or SiF$_4$ with hydrogen. The microcrystalline semiconductor film can also be formed with a dilution with one or plural kinds of rare gas elements selected from helium, argon, krypton, and neon in addition to the compound containing silicon (e.g., silicon hydride) and hydrogen. In that case, the flow rate ratio of hydrogen to the compound containing silicon (e.g., silicon hydride) is greater than or equal to 5:1 and less than or equal to 200:1, preferably greater than or equal to 50:1 and less than or equal to 150:1, and further preferably 100:1. Further, a hydrocarbon gas such as CH$_4$ or C$_2$H$_6$, a germanium gas such as GeH$_4$ or GeF$_4$, F$_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, shown is an example in which light received by the photodiode 602 from a surface of the substrate 601, over which the pin photodiode is formed, is converted into electric signals. Light from the semiconductor film having a conductivity type opposite to that of the semiconductor film on the light-receiving plane is disturbance light; therefore, the electrode layer is preferably formed using a light-blocking conductive film. Note that the n-type semiconductor film side may alternatively be a light-receiving plane.

With the use of an insulating material, the insulating film 632, the interlayer insulating film 633, and the interlayer insulating film 634 can be formed, depending on the material, using a method such as a sputtering method, a plasma CVD method, an SOG method, spin coating, dipping, spray coating, a droplet discharge method (such as an inkjet method), screen printing, or offset printing, or a tool such as a doctor knife, a roll coater, a curtain coater, or a knife coater.

In this embodiment, an aluminum oxide film is used as the insulating film 633. The insulating layer 633 can be formed by a sputtering method or a plasma CVD method.

The aluminum oxide film provided as the insulating film 633 over the oxide semiconductor layer has a high shielding effect (blocking effect) of preventing penetration of both oxygen and impurities such as hydrogen and moisture.

Therefore, in and after the manufacturing process, the aluminum oxide film functions as a protective film for preventing entry of impurities such as hydrogen or moisture, which can cause variation, into the oxide semiconductor layer and release of oxygen, which is a main component material of the oxide semiconductor layer, from the oxide semiconductor layer.

In the transistor 640, the side surfaces of an oxide semiconductor layer in the channel length direction are covered with a source electrode layer and a drain electrode layer, whereby light is prevented from entering the oxide semiconductor layer through the side surfaces. Further, entry of light from above into the oxide semiconductor layer is prevented by a gate electrode layer and a conductive layer provided on a side surface of the gate electrode layer in the channel length direction. In other words, the source electrode layer, the drain electrode layer, the gate electrode layer, and the conductive layer on the side surface of the gate electrode layer also function as light-blocking films. Thus, photodegradation of the oxide semiconductor layer can be suppressed, resulting in a reduction in the amount of change in the threshold voltage of the transistor 640 before and after a bias-temperature stress test (a BT test), and a highly reliable semiconductor device can be provided as the semiconductor device of this embodiment illustrated in FIGS. 7A and 7B.

The insulating film 631, the interlayer insulating film 632, and the insulating film 633 can be made of an inorganic insulating material and can have a single-layer structure or a stacked-layer structure including any of oxide insulating films such as a silicon oxide film, a silicon oxynitride film, an aluminum oxide film, and an aluminum oxynitride film; and nitride insulating films such as a silicon nitride film, a silicon nitride oxide film, an aluminum nitride film, and an aluminum nitride oxide film.

To reduce surface roughness, an insulating film functioning as a planarization insulating film is preferably used as the interlayer insulating film 634. For the interlayer insulating film 634, for example, an organic insulating material having heat resistance such as polyimide, an acrylic resin, a benzocyclobutene-based resin, polyamide, or an epoxy resin can be used. Other than such organic materials, it is also possible to use a single layer or stacked layers of a low-dielectric constant material (a low-k material), a siloxane-based resin, phosphosilicate glass (PSG), borophosphosilicate glass (BPSG), or the like.

Data on an object to be detected can be read by detecting light that enters the photodiode 602. Note that a light source such as a backlight can be used at the time of reading data on the object to be detected.

It is thus possible to provide a miniaturized and highly integrated semiconductor device which has excellent electrical characteristics, and a method for manufacturing the semiconductor device This embodiment can be implemented in appropriate combination with the structures described in the other embodiments.

Embodiment 4

In this embodiment, electronic devices on each of which a display panel or a light-emitting panel including the transistor shown in the above embodiments is mounted will be described with reference to FIGS. 8A to 8E.

Examples of an electronic device to which a semiconductor device is applied include a television device (also referred to as a television or a television receiver), a monitor of a computer or the like, a camera such as a digital camera or a digital video camera, a digital photo frame, a cellular phone handset (also referred to as a cellular phone or a cellular phone device), a portable game machine, a portable information terminal, an audio reproducing device, a large-sized game machine such as a pin-ball machine, and the like. FIGS. 8A to 8E illustrate specific examples of these electronic devices.

FIG. 8A illustrates an example of a television device. In a television device 7100, a display portion 7103 is incorporated in a housing 7101. The display portion 7103 is capable of displaying images, and a display panel can be used for the display portion 7103. In addition, here, the housing 7101 is supported by a stand 7105.

The television device 7100 can be operated with an operation switch provided in the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data to be output from the remote controller 7110.

Note that the television device 7100 is provided with a receiver, a modem, and the like. With the receiver, general television broadcasting can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

FIG. 8B illustrates a computer, which includes a main body 7201, a housing 7202, a display portion 7203, a keyboard 7204, an external connection port 7205, a pointing device 7206, and the like. Note that this computer is manufactured by using a display panel for the display portion 7203.

FIG. 8C illustrates a portable game machine, which includes two housings, a housing 7301 and a housing 7302, connected to each other via a joint portion 7303 so that the portable game machine can be opened or closed. A display portion 7304 is incorporated in the housing 7301 and a display portion 7305 is incorporated in the housing 7302. In addition, the portable game machine illustrated in FIG. 8C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), and a microphone 7312), and the like. It is needless to say that the structure of the portable game machine is not limited to the above structure as long as a display panel is used for at least either the display portion 7304 or the display portion 7305, or both, and may include other accessories as appropriate. The portable game machine illustrated in FIG. 8C has a function of reading out a program or data stored in a storage medium to display it on the display portion, and a function of sharing information with another portable game machine by wireless communication. Note that the portable game machine illustrated in FIG. 8C can have a variety of functions without limitation to those above.

FIG. 8D illustrates an example of a cellular phone. A cellular phone 7400 is provided with a display portion 7402 incorporated in a housing 7401, an operation button 7403, an external connection port 7404, a speaker 7405, a microphone 7406, and the like. Note that the cellular phone 7400 is manufactured using a display panel for the display portion 7402.

When the display portion 7402 of the cellular phone 7400 illustrated in FIG. 8D is touched with a finger or the like, data can be input to the cellular phone 7400. Further, operations such as making a call and creating e-mail can be performed by touch on the display portion 7402 with a finger or the like.

There are mainly three screen modes for the display portion 7402. The first mode is a display mode mainly for displaying an image. The second mode is an input mode mainly for inputting information such as characters. The third mode is a display-and-input mode in which two modes of the display mode and the input mode are mixed.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are changed by touch on the display portion 7402 or operation with the operation button 7403 of the housing 7401. Alternatively, the screen modes can be changed depending on the kind of image displayed on the display portion 7402. For example, when a signal for an image to be displayed on the display portion is data of moving images, the screen mode is changed to the display mode. When the signal is text data, the screen mode is changed to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal identification can be performed. Furthermore, when a backlight or a sensing light source which emits near-infrared light is provided for the display portion, an image of a finger vein, a palm vein, or the like can also be taken.

FIG. 8E illustrates an example of a flat computer. A flat computer 7450 includes a housing 7451L and a housing 7451R connected by hinges 7454. The flat computer 7450 further includes an operation button 7453, a left speaker 7455L, and a right speaker 7455R. In addition, a side surface of the flat computer 7450 is provided with an external connection port 7456, which is not illustrated. Note that when the flat computer is folded on the hinges 7454 so that the display portion 7452L provided in the housing 7451L and the display portion 7452R provided in the housing 7451R can face each other, the display portions can be protected by the housings.

Each of the display portions 7452L and 7452R is a component which can display images and to which information can be input by touch with a finger or the like. For example, when the icon for the installed program is selected by touch with a finger, the program can be started. Further, changing the distance between fingers touching two positions of the displayed image enables zooming in or out on the image. Drag of a finger touching one position of the displayed image enables drag and drop of the image. Moreover, selection of the displayed character or symbol on the displayed image of a keyboard by touch with a finger enables information input.

Further, the flat computer 7450 can also include a gyroscope, an acceleration sensor, a global positioning system (GPS) receiver, fingerprint sensor, or a video camera. For example, when a detection device including a sensor for detecting inclination, such as a gyroscope or an acceleration sensor, is provided, display on the screen can be automatically changed by determining the orientation of the flat computer 7450 (whether the computer is placed horizontally or vertically for a landscape mode or a portrait mode).

Furthermore, the flat computer 7450 can be connected to a network. The flat computer 7450 not only can display information on the Internet but also can be used as a terminal which controls another electronic device connected to the network from a distant place.

This embodiment can be implemented in appropriate combination with the structures described in the other embodiments.

EXAMPLE

In this example, a conductive film was processed by the method for manufacturing a semiconductor device of one embodiment of the present invention, and it was confirmed that a gate electrode layer and a conductive layer on the side surface of the gate electrode layer, which had the shape shown in Embodiment 1, could be obtained.

A method for manufacturing a sample of Example will be shown below.

First, a silicon substrate was prepared, and a silicon nitride oxide film was deposited to a thickness of 20 nm over the substrate by a CVD method. This silicon nitride oxide film corresponds to the gate insulating layer of the transistor according to one embodiment of the present invention; thus, it is referred to as a gate insulating layer in this example.

Then, a conductive film was formed over the gate insulating layer. As the conductive film, a tantalum nitride film with a thickness of 30 nm was deposited by a sputtering method under a mixed atmosphere of argon and nitrogen ($Ar:N_2=50$ sccm:10 sccm) at a pressure of 0.6 Pa and a power of 1 kW, and thereover, a tungsten film with a thickness of 135 nm was deposited by a sputtering method under an argon atmosphere ($Ar=100$ sccm) at a pressure of 2.0 Pa and a power of 4 kW.

After that, the tungsten film was subjected to inductively coupled plasma (ICP) etching treatment under a mixed atmosphere of chlorine, carbon tetrafluoride, and oxygen ($Cl_2:CF_4:O_2=45$ sccm:55 sccm:55 sccm), at a power of 3 kW, a bias power of 50 W, and a pressure of 0.67 Pa, whereby a patterned tungsten layer was obtained.

Then, the tantalum nitride film was subjected to ICP etching treatment under a chlorine atmosphere ($Cl_2=100$ sccm) at a power of 1 kW, a bias power of 60 W, and a pressure of 0.2 Pa, whereby a patterned tantalum nitride layer was obtained. A stack of the tantalum nitride layer and the tungsten layer corresponds to the gate electrode layer of the transistor according to one embodiment of the present invention; thus, it is referred to as a gate electrode layer in this example.

Next, a tungsten film was deposited to a thickness of 30 nm by a sputtering method so as to cover the gate electrode layer. The deposition was performed under an argon atmosphere ($Ar=50$ sccm) at a pressure of 0.6 Pa and a power of 1 kW.

Then, a silicon nitride oxide film was deposited to a thickness of 150 nm over the tungsten film by a CVD method.

After that, the silicon nitride oxide film was subjected to ICP etching treatment under a mixed atmosphere of trifluoromethane and helium ($CHF_3:He=30$ sccm:120 sccm) at a power of 3 kW, a bias power of 200 W, and a pressure of 2.0 Pa. The silicon nitride oxide film obtained by the etching treatment corresponds to the sidewall insulating layer of the transistor according to one embodiment of the present invention; thus, it is referred to as a sidewall insulating layer in this example.

Then, with the sidewall insulating layer used as a mask, the tungsten film was subjected to ICP etching treatment under a mixed atmosphere of carbon tetrafluoride, chlorine, and oxygen (CF$_4$:Cl$_2$:O$_2$=50 sccm:50 sccm:20 sccm), at a power of 500 W, a bias power of 10 W, and a pressure of 1.6 Pa, whereby a conductive layer (a tungsten layer in this example) was formed on the side surface of the gate electrode layer.

Figure 9:
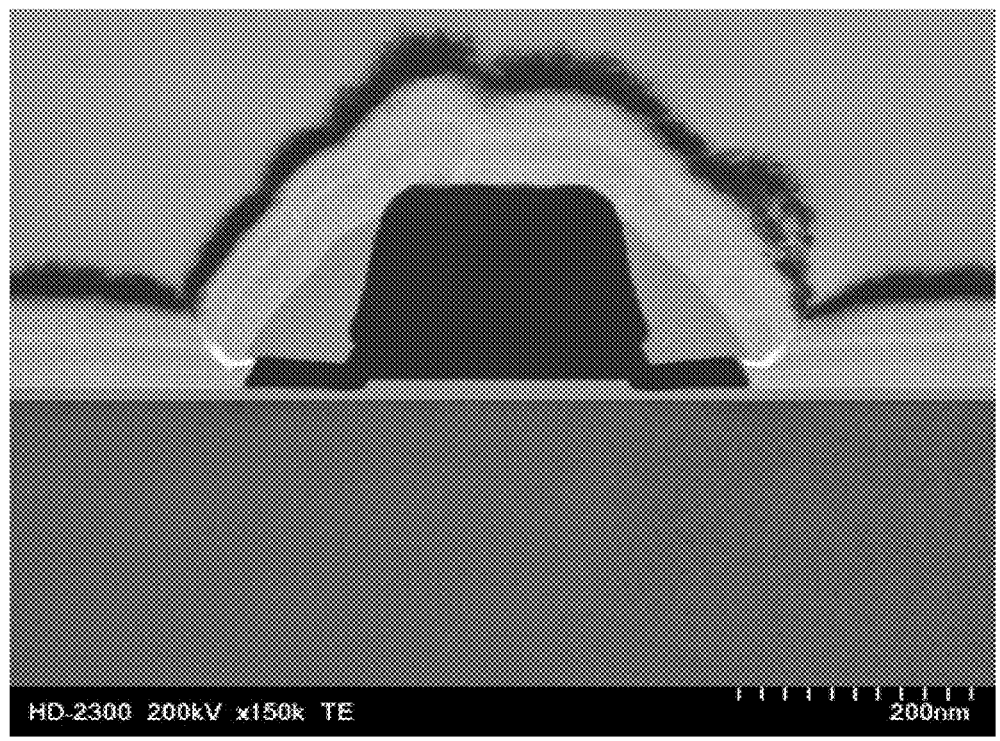
FIG. 9 is a cross-sectional STEM image of a sample in Example.

The sample of Example manufactured by the aforementioned method was observed by a scanning transmission electron microscopy (STEM), and its cross-sectional image (cross-sectional STEM image) is shown in FIG. 9.

FIG. 9 shows that the gate electrode layer and the conductive layer on the side surface of the gate electrode layer, which have the shape shown in Embodiment 1, could be obtained by the manufacturing method described in this example.

Note that in the sample of Example, like in FIG. 4B, the height of the sidewall insulating layer (the distance from the substrate surface to the upper surface of the sidewall insulating layer) is lower than that of the conductive layer (the distance from the substrate surface to the upper surface of the conductive layer). Further, in FIG. 9, a region of the gate insulating layer which overlaps with the gate electrode layer has a thickness larger than that of another region of the gate insulating layer which overlaps with the conductive layer. Specifically, in the sample of Example, the region of the gate insulating layer which overlaps with the gate electrode layer had a thickness of 17.9 nm, and the region of the gate insulating layer which overlaps with the conductive layer had a thickness of 11.2 nm. It seems that this is because the gate insulating layer as well as the gate electrode layer was etched at the same time.

Note that the side edge of the conductive layer in the sample of this example is provided on the inner side of the side edge of the sidewall insulating layer in the channel length direction. One of the technical ideas of the disclosed invention is that a conductive layer is etched by using as a mask a sidewall insulating layer formed in a self-aligned manner, so that an Lov region is formed in a miniaturized transistor without a photolithography step. Therefore, a difference as small as misalignment of edges caused by etching conditions and the like in the case where etching is performed using the same mask (or a layer is etched with an upper layer thereof used as a mask), is completely acceptable and the edges of the layers etched using the same mask are considered to be aligned.

This application is based on Japanese Patent Application serial No. 2011-247936 filed with Japan Patent Office on Nov. 11, 2011, the entire contents of which are hereby incorporated by reference.

What is claimed is:

1. A semiconductor device comprising:
a source electrode layer and a drain electrode layer;
an oxide semiconductor layer comprising a first impurity region, a second impurity region, and a channel region sandwiched between the first impurity region and the second impurity region, wherein a side surface of the first impurity region is in contact with the source electrode layer in a channel-length direction and a side surface of the second impurity region is in contact with the drain electrode layer in the channel-length direction;
a gate insulating layer over and in contact with the oxide semiconductor layer, the source electrode layer, and the drain electrode layer;
a gate electrode layer over the gate insulating layer, wherein the gate electrode layer overlaps with the channel formation region;
a conductive layer having a first portion in contact with a side surface of the gate electrode layer and a second portion in contact with an upper surface of the gate insulating layer, wherein at least part of the second portion overlaps with the source electrode layer and the drain electrode layer;
a sidewall insulating layer in contact with an outer side surface of the first portion and an upper surface of the second portion, wherein the sidewall insulating layer is not in contact with the gate electrode layer; and
wherein the source electrode layer has a tapered shape,
wherein the drain electrode layer has a tapered shape,
wherein a first edge of the oxide semiconductor layer overlap with the source electrode layer, and
wherein a second edge of the oxide semiconductor layer overlap with the drain electrode layer.

2. The semiconductor device according to claim 1, wherein the oxide semiconductor layer comprises a material selected from indium, gallium, and zinc.

3. A semiconductor device comprising:
a source electrode layer and a drain electrode layer;
an oxide semiconductor layer;
a gate insulating layer over and in contact with the oxide semiconductor layer; and
a gate electrode layer over the gate insulating layer,
wherein the source electrode layer has a tapered shape,
wherein the drain electrode layer has a tapered shape,
wherein a first edge of the oxide semiconductor layer overlaps with the source electrode layer, and
wherein a second edge of the oxide semiconductor layer overlaps with the drain electrode layer,
further comprising a conductive layer having a first portion in contact with a side surface of the gate electrode layer and a second portion in contact with an upper surface of the gate insulating layer.

4. The semiconductor device according to claim 3, wherein the oxide semiconductor layer comprises a material selected from indium, gallium, and zinc.

5. The semiconductor device according to claim 3, wherein the oxide semiconductor layer includes a first impurity region, a second impurity region, and a channel region sandwiched between the first impurity region and the second impurity region.

6. The semiconductor device according to claim 3, wherein the gate insulating layer is over and in contact with the source electrode layer.

7. The semiconductor device according to claim 3, wherein the gate insulating layer is over and in contact with the drain electrode layer.

8. The semiconductor device according to claim 3, further comprising a sidewall insulating layer in contact, with an outer side surface of the first portion and an upper surface of the second portion, wherein the sidewall insulating layer is not in contact with the gate electrode layer.

* * * * *